United States Patent
Onabe et al.

(10) Patent No.: US 6,743,531 B2
(45) Date of Patent: Jun. 1, 2004

(54) OXIDE SUPERCONDUCTING CONDUCTOR AND ITS PRODUCTION METHOD

(75) Inventors: Kazunori Onabe, Toyko (JP); Takashi Saito, Tokyo (JP); Naoji Kashima, Kounan (JP); Shigeo Nagaya, Nagoya (JP)

(73) Assignees: Fujikura Ltd., Tokyo (JP); Chubu Electric Power Company Incorporated, Aichi-ken (JP)

( * ) Notice: Subject to any disclaimer, the term of this patent is extended or adjusted under 35 U.S.C. 154(b) by 0 days.

(21) Appl. No.: 10/177,962

(22) Filed: Jun. 19, 2002

(65) Prior Publication Data

US 2003/0134749 A1 Jul. 17, 2003

(30) Foreign Application Priority Data

Jun. 22, 2001 (JP) ........................... 2001-190243
Jun. 22, 2001 (JP) ........................... 2001-190244
Sep. 18, 2001 (JP) ........................... 2001-283928

(51) Int. Cl.$^7$ ........................... H01B 12/00; H01F 6/00; H01L 39/00; B05D 5/12
(52) U.S. Cl. ........................... 428/699; 428/702; 428/930; 505/237; 505/434; 505/447; 427/62; 427/327
(58) Field of Search ........................... 505/230, 236, 505/237, 430, 434, 500, 447; 427/62, 63, 225.23, 255.395, 327, 328; 428/610, 699, 702, 930

(56) References Cited

U.S. PATENT DOCUMENTS 5,472,527 A * 12/1995 Otto et al. ........................... 505/431
5,935,911 A * 8/1999 Yamada et al. ........................... 505/230
5,958,599 A * 9/1999 Goyal et al. ........................... 428/457
6,066,599 A * 5/2000 Otto et al. ........................... 505/231
6,219,901 B1 * 4/2001 Podtburg et al. ........................... 29/599

* cited by examiner

Primary Examiner—Stanley S. Silverman
Assistant Examiner—Colleen P. Cooke
(74) Attorney, Agent, or Firm—Darby & Darby

(57) ABSTRACT

The object of the present invention is to provide an oxide superconducting conductor having superior strength and superconductor characteristics, and its production method.

In order to achieve the above object, the present invention provides an oxide superconducting conductor having an oxide superconductor layer obtained by a method in which a raw material gas of an oxide superconductor is chemically reacted on a base material for forming an oxide superconductor provided with an Ag layer having a rolling texture formed on at least one side of a base material containing Ag base material or other base metal, a diffusion layer in which Cu is diffused in Ag is formed on the surface layer of the oxide superconductor layer side of the above base material, and the above oxide superconductor layer is formed on the above diffusion layer; and, an oxide superconducting conductor comprising the sequential generation of a plurality of layers of oxide superconductor containing Cu by CVD on an Ag layer of a base material for forming an oxide superconducting conductor provided with an Ag layer having a rolling texture formed on at least one side of an Ag base material or other base metal, and among the above plurality of oxide superconductor layers, the Cu content of the oxide superconductor layer immediately above the base material is made to have a higher concentration than the Cu content of the other oxide superconductor layers.

22 Claims, 9 Drawing Sheets

OXIDE SUPERCONDUCTING CONDUCTOR AND ITS PRODUCTION METHOD

BACKGROUND OF THE INVENTION

1. Technical Field

The present invention relates to an oxide superconducting conductor, and its production method, that can be used in fields such as superconducting power cables, superconducting magnets, superconductive energy storage, superconducting power generation systems, medical MRI systems and superconducting current leads.

2. Background Art

Known methods of producing oxide superconducting conductors of the prior art include solid phase methods such as the powder-in-tube (PIT) method in which a powder of an oxide superconductor, or a mixed powder of a composition that is able to become an oxide superconductor by heat treatment, is pressed into the shape of a cylindrical column, inserted into a silver tube and then drawn or rolled followed by a heat treatment step to form a wire material, as well as film deposition methods in which an oxide superconductor layer is continuously formed on a long base material such as metal tape by a vapor phase method such as laser deposition or sputtering.

As shown in FIG. 11, the structure of oxide superconducting conductors produced by a vapor phase method such as laser deposition or CVD is widely known to consist of the formation of a YBaCuO-based oxide superconductor layer 193 formed on the upper surface of a base material 191 composed of a metal such as Ag, and the formation of a surface protective layer 195 composed of Ag on this oxide superconductor layer 193.

In order to obtain superior superconductor characteristics in such oxide superconducting conductors produced by a vapor phase method such as laser deposition of CVD, it is important to realize biaxial orientation (in-plane orientation) of oxide superconductor layer 193 produced on base material 191. In order to accomplish this, it is preferable that the lattice constant of base material 191 approach the lattice constant of oxide superconductor layer 193, and that the crystal grains that compose the surface of base material 191 be uniformly arranged in the manner of pseudo single crystals.

Therefore, in order to solve this problem, as shown in FIG. 12, various attempts have been made to produce an oxide superconducting conductor having superior superconductivity by forming a polycrystalline intermediate layer 192 such as YSZ (yttrium-stabilized zirconium) using a sputtering device on the upper surface of a metal base material 191 such as hastelloy tape, forming an oxide superconductor layer 193 such as YBaCuO on this polycrystalline intermediate layer 192, and then additionally forming a stabilizing layer 194 of Ag on the oxide superconductor layer 193. Alternatively, studies have also been conducted on Ag base materials in which a texture is formed by rolling and heat treatment, and Ni base materials in which a texture is formed by rolling and heat treatment followed additionally by the formation of an oxide intermediate layer.

Among these, since Ag is the only metal material that has little reactivity with oxide superconductor layer 193 and allows oxide superconductor layer 193 to be formed directly on base material 191, while also having the characteristics of being non-magnetic and having low resistance, a wire material structure can be realized in which base material 191 itself also functions as the stabilizing layer.

Examples of materials that have been developed as Ag base materials in the form of tape that form a texture by rolling and heat treatment include Ag {100}<001> having surface {100} for the surface of the base material and a cube texture in which <001> is preferentially oriented in the lengthwise direction, or Ag {110}<110> having surface (110) for the surface of the base material and a cube texture in which <110> is preferentially oriented in the lengthwise direction, and in consideration of lattice matching with a YBaCuO-based oxide superconductor layer, the Ag {110}<110> oriented Ag base material is the more promising.

In an oxide superconducting conductor in which oxide superconductor layer 193 is formed on a polycrystalline intermediate layer 192 as shown in FIG. 12, the surface formed by oxide superconductor layer 193 has superior smoothness and in-plane orientation due to the action of this polycrystalline intermediate layer 192, thereby allowing the obtaining of an oxide superconductor layer 193 having a satisfactory in-plane orientation, and has recently been confirmed to enable a high Jc value of 1,000,000 A/cm$^2$ or higher. In addition, since hastelloy is used as the metal tape, wire materials can be produced having adequate strength. However, since base materials equipped with this polycrystalline intermediate layer 192 require the use of sophisticated and expensive technology in the form of ion beam sputtering for their film deposition, at present, these base materials are only able to be produced at the rate of about 1 meter per hour, while also having the disadvantage of extremely high production costs.

On the other hand, in an oriented Ag base material using a rolling texture of Ag, although the productivity of the base material can be increased and production costs are comparatively low making this promising, there are hardly any reports of obtaining a high Jc value of 100,000 A/cm2 or more using this oriented Ag base material, thereby resulting in the problem of insufficient superconductor characteristics. This is thought to be due to impaired continuity of the oxide superconductor layer caused by irregularities in the crystal grain boundary of the Ag base material. In addition, in the case of using an Ag base material, since Ag itself is an extremely soft metal and is softened even more as a result of being heated to a high temperature during deposition of the oxide superconductor layer, in order to apply oxide superconductors using an Ag base material to wire materials and so forth, it is necessary to solve the problem of strength.

SUMMARY OF THE INVENTION

The object of the present invention is to provide an oxide superconducting conductor having superior strength and superconductor characteristics by using a base material consisting mainly of Ag, its production method, and an oxide superconducting conductor base material.

The inventors of the present invention conducted the following test in order to investigate the cause of being unable to obtain a high Jc value with a superconducting conductor using an oriented Ag base material during completion of the oxide superconducting conductor and its production method of the present invention. Although the oriented Ag base material is promising with respect to allowing the production of an oxide superconducting conductor at low costs, it had the disadvantage of not allowing the obtaining of adequate current density (Jc).

(1) After producing an oxide superconducting conductor by forming a YBaCuO-based superconducting layer having a thickness of 1.0 μm on a pure Ag base material measuring 10 mm (W)×10 mm (L)×0.5 mm (t) by CVD, and the removing only the oxide superconductor layer of the sample by etching, the amounts of the elements Y, Ba and Cu contained in the pure Ag base material were analyzed, and a comparison was made with the contents of each element in the pure Ag base material prior to deposition. Those results are shown in Table 1. As shown in Table 1, the Cu content of the pure Ag base material after formation of the oxide superconductor layer had clearly increased significantly. This is thought to be due to the Cu contained in the YBaCuO that composes the oxide superconductor layer having reacted by diffusing in the pure Ag base material.

TABLE 1

| Sample 10 mm × 10 mm × 0.5 mm | | Ag weight (g) | Y (μg) analyzed value/ difference | Ba (μg) analyzed value/ difference | Cu (μg) analyzed value/ difference |
|---|---|---|---|---|---|
| Ag base material | | 0.525 | 0.0/— | 1.6/— | 11/— |
| Ag base material after forming oxide superconductor layer | No.1 | 0.56 | 0.1/0.1 | 1.8/0.2 | 49/38 |
| | No. 2 | 0.584 | 0.1/0.1 | 1.5/0.0 | 41/30 |

(2) Next, a detailed analysis was conducted on the surface of the sample from which the above oxide superconductor layer had been removed. As a result, in the Ag base material after formation of the oxide superconductor layer, the Cu concentration at the Ag crystal grain boundary of the surface had increased in particular. Namely, elementary Cu diffused on the side of the Ag base material was determined to have preferentially precipitated or diffused at the crystal grain boundary of the Ag.

Based on the above tests (1) and (2), the inventors of the present invention concluded that there is the possibility that the superconductor characteristics of oxide superconducting conductors deteriorate due to the effects of Cu diffused in the Ag base material from the oxide superconductor layer, and found that it is necessary to pay attention to the following matters when producing a YBaCuO-based oxide superconducting conductor using Ag for the base material.

(1) Diffusion of elementary Cu at the interface between the Ag base layer and oxide superconductor layer should be suppressed.
(2) Grain boundary growth on the surface of the Ag base material should be suppressed and a smooth base material surface should be maintained.

In order to satisfy the conditions of (1) and (2) above, a study was conducted involving the initial formation of a layer containing Cu prior to the oxide superconductor layer on the surface layer of the Ag base material. Namely, by forming a layer in which Cu is diffused in advance on the surface of the Ag base material, the surface of the Ag base material can be made to contain a suitable concentration of Cu, (1) thereby making it possible to alleviate the diffusion of elementary Cu into the Ag base material. In addition, as a result, this was found to (2) suppress grain boundary growth on the surface of the base material and make it possible to maintain the smoothness of the base material surface, thereby leading to completion of the present invention. In addition, the inventors found that increasing the Cu concentration of the oxide superconductor layer in the vicinity of the interface between the base material and oxide superconductor layer could be used as a constitution that satisfies the requirements of (1) and (2) above, thereby leading to completion of the present invention.

The oxide superconducting conductor of the present invention is an oxide superconducting conductor having an oxide superconductor layer obtained by a method in which a raw material gas of an oxide superconductor is chemically reacted on at least one side of a base material containing Ag and deposited on the above base material, wherein a diffusion layer in which Cu is diffused in Ag is formed on the surface layer on the oxide superconductor layer side of the above base material, and the above oxide superconductor layer is formed on said diffusion layer.

Namely, by forming a diffusion layer in which Cu is diffused in the surface layer of an Ag base material in advance, the diffusion of Cu into the Ag base material from the oxide superconductor layer can be suppressed, and since grain boundary growth on the surface of the Ag base material can also be suppressed, there is no disturbance of the alloy composition of the oxide superconductor layer and no impairment of crystal continuity, thereby allowing the obtaining of an oxide superconducting conductor having superior superconductor characteristics.

In the oxide superconducting conductor of the present invention, the above base material is preferably composed of pure Ag. As a result of employing this constitution, the degree of accumulation (degree of orientation of Ag crystals) of the texture formed by rolling and heat treatment can be improved more than that of a base material that uses an alloy in which a second element is added to the Ag. Consequently, the crystal orientation of the oxide superconductor layer formed on this base material can be improved, and an oxide superconducting conductor can be provided having superior superconductor characteristics.

Next, the oxide superconducting conductor of the present invention is characterized by being provided with an oxide superconducting conductor base material provided with a base metal in the form of a tape and an Ag layer having a rolling texture formed on at least one side of said base metal, a diffusion layer formed by diffusing Cu in the surface layer of the Ag layer of the above base material, and an oxide superconductor layer formed on the above diffusion layer.

Namely, the oxide superconducting conductor of the present invention considerably improves strength more than conventional Ag base materials by using a base material having a two-layer structure provided with an Ag layer having a rolling texture on a base metal. In addition, since the diffusion of Cu from the oxide superconductor layer into the Ag base material can be effectively suppressed by forming a diffusion layer in which Cu is diffused in the surface layer of the Ag layer, resulting grain boundary growth of the oxide superconductor layer on the surface of the Ag base material can also be suppressed, thereby eliminating disturbance of the composition of the oxide superconductor layer and impairment of crystal continuity, and making it possible to obtain an oxide superconducting conductor having superior superconductor characteristics.

Next, the oxide superconducting conductor of the present invention is characterized by being an oxide superconducting conductor comprising the sequential generation of a plurality of layers of an oxide superconductor containing Cu by CVD on a base material for forming an oxide superconductor provided with an Ag layer having a rolling texture formed on at least one side of an Ag base material or other base metal, wherein among the above plurality of oxide superconductor layers, the Cu content of the oxide superconductor layer immediately above the base material is made to have a higher concentration than the Cu content of the other oxide superconductor layers.

Since the oxide superconductor layer directly above the Ag of the base material is generated by supplying a Cu raw material composition in excess, the multi-layer oxide superconducting conductor containing Cu of the present invention allows the obtaining of an oxide superconductor layer of the target composition even if elementary Cu is diffused in the Ag of the above base material, and the oxide superconductor layers sequentially generated thereon can also be made to be an oxide superconducting conductor having an oxide superconductor of the target composition.

Next, the oxide superconducting conductor of the present invention is preferably composed such that the Cu content of the above diffusion layer is from 50 $\mu g/cm^2$ to 300 $\mu g/cm^2$. As a result of employing this constitution, diffusion of Cu from the oxide superconductor layer can be effectively prevented. If the above Cu content is less than 50 $\mu g/cm^2$, the effect of suppressing the diffusion of Cu from the oxide superconductor layer is unable to be obtained, while in the case the Cu content exceeds 300 $\mu g/cm^2$, the Cu contained in the diffusion layer reacts with oxygen gas during formation of the oxide superconductor layer, resulting in its precipitation in the form of CuO and other oxides, thereby making this undesirable.

Next, the oxide superconducting conductor of the present invention is preferably composed such that the thickness of the above diffusion layer is within the range of 100 nm to 300 nm. Employing such a constitution enables the crystal orientation and crystal continuity of the oxide superconductor layer to be improved, making it possible to provide an oxide superconducting conductor having superior superconductor characteristics. In the case the thickness of the above diffusion layer is less than 100 nm, diffusion of Cu from the oxide superconductor layer cannot be prevented due to the insufficient amount of Cu contained in the diffusion layer, while if the thickness exceeds 300 nm, the excess Cu reacts with oxygen gas used during formation of the oxide superconductor layer resulting in precipitation of CuO and other oxides, thereby making this undesirable.

Next, in the oxide superconducting conductor of the present invention, the thickness of the above Ag layer is preferably within the range of 10 $\mu m$ to 100 $\mu m$. If the thickness of the Ag layer is less than 10 $\mu m$, the composite elements of the base metal are diffused into the superconducting layer through the Ag layer, making this undesirable. In addition, in the case the thickness exceeds 100 $\mu m$, the amount of Ag used becomes large resulting in high cost of the base material, which is also undesirable.

Next, the oxide superconducting conductor of the present invention can also be composed to be provided with a barrier layer between the above Ag layer and base metal. Since the use of this constitution makes it possible to suppress the diffusion of elements that compose the base metal into the Ag layer and oxide superconductor layer, the texture of the Ag layer and the crystal structure of the oxide superconductor layer can be favorably maintained, thereby making it possible to obtain satisfactory crystal orientation and crystal continuity of the oxide superconductor layer formed on the Ag layer.

In addition, the oxide superconducting conductor provided with the above barrier layer can be composed such that the thickness of the above Ag layer is from 5 $\mu m$ to 10 $\mu m$. Namely, the above barrier layer is able to prevent the diffusion of elements that compose the base metal into the Ag layer and oxide superconductor layer formed on the Ag layer. Thus, according to the present constitution, an oxide superconductor layer provided with satisfactory crystal continuity can be formed even if the Ag layer is thin, thereby making it possible to provide an oxide superconducting conductor having superior superconductor characteristics. In addition, if the thickness of the Ag layer in this oxide superconducting conductor equipped with a barrier layer is less than 5 $\mu m$, it becomes difficult to laminate the Ag layer (Ag foil) to the barrier layer, thereby making this impractical. In addition, if the thickness exceeds 10 $\mu m$, this leads to an increase in the cost of the base material, thereby making this undesirable.

Next, in the oxide superconducting conductor as claimed in the present invention, the Cu content of the oxide superconductor layer directly above the base material preferably has a concentration that is no more than 19% higher than the Cu content of the other oxide superconductor layers. Here, no higher than 19% means that the excess amount of Cu is greater than 0% but equal to or less than 19%. As a result of employing this constitution, an oxide superconductor layer having a prescribed composition can be formed on an oxide superconductor layer having a high Cu concentration, thereby allowing the obtaining of superior superconductor characteristics. If the above difference in Cu content exceeds 19%, the excess amount of Cu causes the occurrence of different phases such as CuO in the oxide superconductor layer, which is not desirable since it tends to cause deterioration of superconductor characteristics.

Next, the oxide superconducting conductor base material of the present invention is a base material in the form of a tape for composing an oxide superconducting conductor by chemically reacting a raw material gas of an oxide superconductor on at least one side to form an oxide superconductor layer, and is characterized by being provided with an Ag layer comprised of a base metal in the form of a tape and Ag having a rolling texture formed on at least one side of said base metal, the thickness of the above Ag layer being from 10 $\mu m$ to 100 $\mu m$.

Namely, the oxide superconducting conductor base material of the present invention solves the problem of strength that was a problem of conventional Ag base materials by employing a duplex structure in which a layer composed of Ag is formed on a base metal. In addition, since technology used in the production of conventional clad materials can be applied for the technology for depositing or laminating the Ag on the base metal, a high-strength base material can be obtained inexpensively, thereby allowing the production of an oxide superconductor without impairing the advantages of the Ag base material.

Next, the oxide superconducting conductor base material of the present invention is a base material in the form of a tape for composing an oxide superconducting conductor by chemically reacting a raw material gas of an oxide superconductor on at least one side to form an oxide superconductor layer, and is characterized by being provided an Ag layer composed of a base metal in the form of a tape and Ag having a rolling texture formed on at least one side of said base metal, and a barrier layer formed between the above base metal and Ag layer, the thickness of the above Ag layer being from 5 $\mu m$ to 10 $\mu m$.

Employing a constitution provided with a barrier layer between the base metal and Ag layer of the above base material makes it possible to suppress diffusion to the Ag layer side caused by heat treatment for introducing a rolling texture into the Ag layer and heating for forming the oxide superconductor layer. Thus, since the use of the oxide superconducting conductor base material of the present constitution makes it possible to prevent impairment of crystal orientation and crystal continuity of the oxide superconductor layer caused by such diffusion, an oxide superconducting conductor can be realized having superior superconductor characteristics.

Next, the production method of an oxide superconducting conductor of the present invention is a production method of an oxide superconducting conductor in which an oxide superconductor layer is generated on a base material by a method in which a raw material gas of an oxide superconductor is chemically reacted on at least one side of a base material, wherein a diffusion layer containing Cu is deposited on the above base material, and the above oxide superconductor layer is deposited on the above diffusion layer.

As a result of employing this constitution, the diffusion of Cu from the oxide superconductor layer to the Ag base material is suppressed, thereby allowing an oxide superconducting conductor having superior superconductor characteristics to be easily produced. In addition, the diffusion layer containing Cu can be formed easily by ordinary sputtering, vapor deposition or CVD and so forth without requiring the use of sophisticated and expensive film deposition technology for film deposition as in polycrystalline intermediate layers such as YSZ. Thus, according to the present constitution, an oxide superconducting conductor having superior superconductor characteristics can be produced inexpensively.

Next, the production method of an oxide superconducting conductor of the present invention is contains a step in which a diffusion layer in which Cu is diffused is formed on the surface layer of an Ag layer of an oxide superconducting conductor base material provided with a base metal and an Ag layer having a rolling texture formed on at least one side of said base metal, and a step in which an oxide superconductor layer is deposited on said diffusion layer by chemically reacting a raw material gas of an oxide superconductor.

As a result of employing this constitution, the diffusion of Cu from the oxide superconductor layer to the Ag base material is suppressed by the action of the above diffusion layer, and an oxide superconducting conductor having superior superconductor characteristics can be easily produced. In addition, the diffusion layer in which Cu is diffused can be formed easily by ordinary sputtering, vapor deposition or CVD and so forth without requiring the use of sophisticated and expensive film deposition technology for film deposition as in polycrystalline intermediate layers such as YSZ. Thus, according to the present constitution, an oxide superconducting conductor having superior superconductor characteristics can be produced inexpensively.

Next, the production method of an oxide superconducting conductor as claimed in the present invention comprises the generation of an oxide superconductor containing Cu while supplying a composition of a raw material solution of a reaction generation chamber for generating the above oxide superconductor directly on a base material so that the Cu composition is in greater excess than the above oxide superconductor composition, in the generation of a plurality of layers of oxide superconductor containing Cu by CVD on an oxide superconducting conductor base material provided with an Ag layer having a rolling texture formed on at least one side of an Ag base material or other base metal.

According to the production method of an oxide superconducting conductor of the present invention, since a YBaCuO-based superconductor formed directly on at least a base material is generated by supplying a raw material solution composition of a YBaCuO superconductor with the concentration of the Cu raw material in excess, the composite ratio of each element of the YBaCuO-based oxide superconductor layer formed on the oxide superconductor layer having a high Cu concentration can be made to be the composite ratio of a target prescribed YBaCuO-based oxide superconductor. In other words, as a result of making the elementary Cu in the raw material solution to be in excess, even if the above elementary Cu in the raw material solution is diffused in the Ag, since the Cu is made to be in excess in advance, the decrease is adequately compensated thereby allowing the production of an oxide superconducting conductor having a high Jc value and superior superconductor characteristics without disturbing the composition of the oxide superconductor and without impairing crystal continuity.

Next, in the production method of the oxide superconducting conductor, the above diffusion layer is preferably deposited to a layer thickness of 100 nm to 300 nm. As a result of employing this constitution, a suitably controlled diffusion layer can be formed, thereby allowing the production of an oxide superconducting conductor having even more superior superconductor characteristics.

Next, in the production method of an oxide superconducting conductor as claimed in the present invention, it is preferable to use an Ag base material having a rolling texture of a (110) orientation for the above base material. As a result of employing this constitution, a satisfactory crystal orientation can be obtained for the oxide superconductor layer formed on the base material, thereby allowing the production of an oxide superconducting conductor provided with superior superconductor characteristics. The above rolling texture of (110) orientation should be at least formed on the surface of the base material.

Next, in the production method of an oxide superconducting conductor as claimed in the present invention, at least two of the above reaction generation chambers are arranged in series, the composition of the above raw material solution of the above reaction generation chamber for generating the above oxide superconductor directly on the above base material is supplied so that the Cu composition is in greater excess than the composite ratio of the above oxide superconductor, and the raw material solution composition in the remaining reaction generation chamber is made to have a Cu composition that allows the obtaining of a prescribed oxide superconductor composition that is not the Cu composition of the reaction generation chambers that generates directly above the base material.

As a result of employing this constitution, an oxide superconductor layer having a high Cu concentration can be formed directly above the base material, and an oxide superconductor layer having a prescribed composite ratio can be formed on this oxide superconductor layer having a high Cu concentration.

Next, in the production method of an oxide superconducting conductor as claimed in the present invention, the Cu composition in the above reaction generation chamber for generating an oxide superconductor layer directly on the above base material preferably has a concentration that is 1–20% higher than the Cu composition in the other reaction generation chamber.

By making the Cu raw material composition that generates an oxide superconductor layer formed directly above the above Ag base material have a concentration that is within the range of 1–20% higher than the Cu raw material composition that generates an oxide superconductor layer formed thereafter, not only the oxide superconductor layer directly above the Ag base material, but also the entire oxide superconductor layer can be formed to a target composition. If the higher concentration of the above Cu raw material composition is higher by less than 1%, elementary Cu ends up diffusing in the Ag base material, and if it is higher by more than 20%, the elementary Cu becomes excessive, causing the generation of a different phase such as CuO in the oxide superconductor layer, resulting in the occurrence of the problem of being unable to obtain the target oxide superconductor. In addition, by generating an oxide superconductor with the Cu raw material composition in excess by 1–20%, an oxide superconductor layer can be obtained having a high Cu content at a concentration of 19% or less on the Ag base material.

Next, in the production method of an oxide superconducting conductor as claimed in the present invention, the thickness of the Ag layer of the above base material for forming the oxide superconductor is preferably from 10 $\mu$m to 100 $\mu$m. If the thickness of the Ag layer is less than 10 $\mu$m, the composite elements of the base metal diffuse into the oxide superconductor layer through the Ag layer, which is not desirable. In addition, if the thickness of the Ag layer exceeds 100 $\mu$m, the amount of Ag used becomes large, which is also undesirable since it results in increased cost of the base material.

Next, in the production method of an oxide superconducting conductor as claimed in the present invention, a barrier layer can also be formed between the above Ag layer of the above base material for forming the oxide superconductor, and the above base metal.

As a result of employing this constitution, since the elements that compose the base metal can be suppressed from diffusing into the Ag layer and oxide superconductor layer, the texture of the Ag layer and the crystal structure of the oxide superconductor layer can be favorably maintained, the oxide superconductor layer formed on the Ag layer can be made to have satisfactory crystal orientation and crystal continuity.

Moreover, in the production of an oxide superconducting conductor provided with the above barrier layer, the thickness of the above Ag layer is preferably from 5 $\mu$m to 10 $\mu$m. As a result of making the thickness within the above range, the elements that compose the base metal can be prevented from diffusing into the Ag layer and oxide superconductor layer formed on this Ag layer by the above barrier layer. Thus, according to the present constitution, an oxide superconductor layer provided with satisfactory crystal continuity can be formed even if the Ag layer is thin, and an oxide superconducting conductor can be produced in particular that has a high Jc value and superior superconductor characteristics. In addition, if the thickness of the Ag layer in this oxide superconducting conductor provided with a barrier layer is less than 5 $\mu$m, it becomes difficult to laminate the Ag layer (Ag foil) to the barrier layer, thereby making this impractical. In addition, if the thickness exceeds 10 $\mu$m, this leads to an increase in the cost of the base material, thereby making this undesirable.

Next, in the production method of an oxide superconducting conductor as claimed in the present invention, a protective layer composed of a precious metal material can also be formed on the above oxide superconductor layer. As a result of employing this constitution, the oxide superconductor layer can be stabilized, and there is less susceptibility to the occurrence of deterioration of the oxide superconductor layer caused by external effects, thereby allowing the production of an oxide superconducting conductor having superior reliability and a long service life.

Next, in the production method of an oxide superconducting conductor as claimed in the present invention, the above oxide superconductor layer can also be composed from a YBaCuO-based oxide superconductor. The production as claimed in the present invention is a particularly preferable method for the production of an oxide superconducting conductor having a YBaCuO-based superconductor layer.

Next, in the production method of an oxide superconducting conductor as claimed in the present invention, a reactor that carries out a CVD reaction that forms an oxide superconducting thin film by chemically reacting a raw material gas of an oxide superconductor on at least one side of a moving base material in the form of a tape, an oxide superconductor raw material gas supply means that supplies oxide superconductor raw material gas to the above reactor, and a gas exhaust means that evacuates the gas inside the above reactor; an oxide superconductor raw material gas supply source, an oxide superconductor raw material gas feed tube, and an oxygen gas supply means that supplies oxygen gas are provided in the above oxide superconductor raw material gas supply means; and in the above reactor, the base material feed section, reaction generation chambers and base material discharge section are respectively separated by diaphragms, a plurality of the above reaction generation chambers are provided in series in the direction of movement of the above base material tape, base material through holes are formed in each of the above diaphragms, a base material transport region is formed within the above reactor that passes through the base material feed section, the plurality of reaction generation chambers and the base material discharge section, gas diffusion sections are provided in each of the above plurality of reaction generation chambers, the above plurality of reaction generation chambers are made to be deposition regions, and deposition can be carried out by using a deposition apparatus comprised by the above oxide superconductor raw material gas feed tube being connected to said reaction generation chambers via the above gas diffusion section.

As a result of employing this constitution, since the above diffusion layer and oxide superconductor layer or oxide superconductor layer having a multi-layer structure can be deposited continuously, production of oxide superconducting conductors can be carried out more efficiently. Consequently, product yield can be improved and production costs can be reduced. In addition, if production is carried out by assigning the above plurality of reaction generation chambers to a reaction generation chamber for forming a diffusion layer and a reaction generation chamber for forming an oxide superconductor layer, these layers can be formed continuously, thereby allowing production of oxide superconducting conductors to be carried out more efficiently.

Since the oxide superconducting conductor of the present invention is composed by providing a diffusion layer containing Cu between a base material containing Ag and an oxide superconductor layer, diffusion of Cu from the oxide superconductor layer to the Ag base material can be suppressed, and as a result, grain boundary growth on the surface of the Ag base material can also be suppressed, thereby making it possible to obtain an oxide superconducting conductor having superior superconductor characteristics without disturbing the composition of the oxide superconductor layer and without impairing crystal continuity.

Next, according to the present invention, as a result of being composed by providing a base metal, an oxide superconducting conductor base material provided with an Ag layer having a rolling texture formed on at least one side of said base metal, a diffusion layer formed diffusing Cu in the surface layer of the Ag layer of the above oxide superconducting conductor, and an oxide superconductor layer formed on the above diffusion layer, an oxide superconducting conductor can be provided having superior strength and superconductor characteristics.

Next, since the production method of an oxide superconducting conductor of the present invention is made to deposit a diffusion layer containing Cu on an Ag base material, and deposit the above oxide superconductor layer on that diffusion layer, the diffusion of Cu from the oxide superconductor layer to the Ag base material is suppressed, allowing an oxide superconducting conductor having superior superconductor characteristics to be manufactured easily. In addition, the above diffusion layer containing Cu can be easily formed by ordinary sputtering, vapor deposition or CVD and so forth without requiring the use of sophisticated and expensive deposition technology as in a polycrystalline intermediate layer of YSZ and so forth. Thus, according to the present invention, an oxide superconducting conductor having superior superconductor characteristics can be produced inexpensively.

Next, since the oxide superconducting conductor of the present invention uses a base material in which an Ag layer having a rolling texture is formed on an Ag base material that is a material for forming an oxide superconductor or base metal having superior strength and so forth, and forms an oxide superconductor layer having a high Cu content directly above this Ag layer, the oxide superconductor layers formed sequentially thereon allow the generation of an oxide superconductor of a target composition. Consequently, the resulting oxide superconducting conductor has superconductor characteristics consisting of a high Jc value, and can be used as an oxide superconducting conductor having superior strength and other characteristics as well.

Next, as a result of employing a constitution provided with a base metal in the form of a tape and an Ag layer composed of Ag having a rolling texture formed on at least one side of said base metal, the oxide superconducting conductor base material of the present invention solves the problem of strength that had been a problem associated with Ag base materials of the prior art. In addition, since technology for depositing or laminating Ag onto the base metal can apply technology used for the production of clad materials of the prior art, a high-strength base material can be obtained inexpensively, thereby allowing the production of oxide superconductors without impairing the advantages of the Ag base material.

Next, according to the production method of an oxide superconducting conductor of the present invention, together with using an oxide superconducting conductor base material in which an Ag layer having a rolling texture is formed on an Ag base material or base metal, since a constitution is employed in which a diffusion layer in which Cu is diffused is formed on the surface layer of the Ag layer of the base material, and an oxide superconductor layer is formed on this diffusion layer, the diffusion of Cu from the oxide superconductor layer to the Ag base material can be suppressed, and an oxide superconducting conductor having superior superconductor characteristics can be easily produced. Thus, according to the production method as claimed in the present invention, an oxide superconducting conductor having superior superconductor characteristics and high strength can be produced inexpensively.

In addition, in the production method of an oxide superconducting conductor of the present invention, since an oxide superconductor layer formed directly on the above Ag layer is composed to generate an oxide superconductor layer while supplying Cu in greater excess than the Cu composition of oxide superconductor layers sequentially formed thereon, even if elementary Cu is diffused in the Ag, since the shortage of Cu is adequately compensated by the elementary Cu supplied in excess, the generated oxide superconductor allows the production of an oxide superconducting conductor having superconductor characteristics consisting of a high Jc value, and particularly a Jc value of 100,000 A/cm$^2$ or more.

BEST MODE FOR CARRYING OUT THE INVENTION

The following provides a detailed explanation of modes for carrying out the invention with reference to the drawings.

First Mode for Carrying Out the Present Invention

Figure 1:
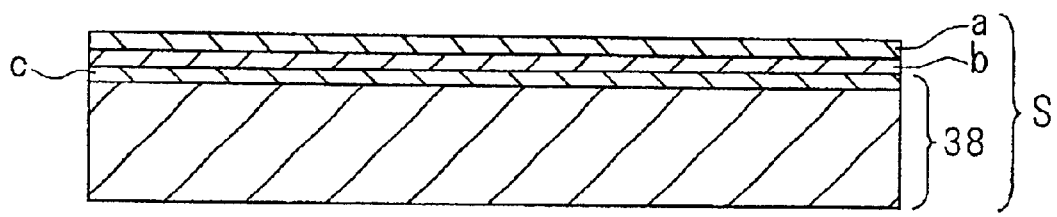
FIG. 1 is a drawing showing the cross-sectional structure of an oxide superconducting conductor that is a first mode for carrying out the present invention.

FIG. 1 is a cross-sectional structural drawing of an oxide superconducting conductor that is one mode for carrying out the present invention. Oxide superconducting conductor S shown in this drawing is composed by laminating in order a base material 38 composed of Ag, an oxide superconductor layer b formed on this base material 38, and a stabilizing layer a composed of Ag formed on this oxide superconductor layer b. Diffusion layer c, which is a layer in which Cu is diffused in the Ag that composes base material 38, is formed on the surface layer of the above base material 38.

Although a long base material can be used for base material 38, the use of Ag oriented tape in which a rolling texture has been generated is preferable, and a diffusion layer in which Cu has been diffused may also be used for the above oriented tape. Alternatively, that provided with an Ag film having a rolling texture on one or both sides of a base in the form of a tape such as metal tape may be used. Examples of materials that compose the above metal tape include silver, platinum, stainless steel, copper, hastelloy (e.g., C276) and other metal materials and alloys.

A {100}<001> texture having surface {100} for the surface of the base material and a cube texture in which <001> is preferentially oriented in the lengthwise direction, a {110}<110> textured having surface {110} for the surface of the base material and a cube texture in which <110> is preferentially oriented in the lengthwise direction, or a {110}<001> texture having surface {110} for the surface of the base material and a cube texture in which <001> is preferentially oriented in the lengthwise direction is preferable for the rolling texture of the above Ag. Since the use of an oriented Ag base material having these textures allows the crystal lattice constant of the surface of the base material to approach the lattice constant of the oxide superconductor layer particularly when forming a YBaCuO-based oxide superconductor layer, the crystallinity of the formed oxide superconductor layer can be improved, and superior superconductor characteristics can be provided.

A perovskite oxide superconductor represented with the structural formula $RE_1M_2Cu_3O_{7-x}$. (RE: 1 type selected from Y, La, Gd, Dy, Ho, Er, Tm, Yb, Nf, Sm and Eu, M: 1 type selected from Ba, Ca and Sr), a Bi system represented with the structural formula $Bi_2Sr_2Ca_{n-1}Cu_nO_{2n+2}$ (n is a natural number), or a Tl system represented with the structural formula $Tl_2Ba_2Ca_{n-1}Cu_nO_{2n+2}$ (n is a natural number) can be applied for oxide superconductor layer b, and should be suitably selected according to the purpose. The use of a Y-based oxide superconductor widely known with the composition of $Y_1Ba_2Cu_3O_{7-x}$ is preferable with respect to matching of the lattice with the Ag of the surface of base material 38.

A characteristic of oxide superconducting conductor S as claimed in the present invention is the providing of diffusion layer c, in which Cu is diffused, on the surface layer of base material 38. Namely, by providing this diffusion layer c in which the concentration of Cu has been increased, since the diffusion of Cu contained in oxide superconductor layer b to the side of base material 38 can be effectively prevented, impairment of the crystal orientation and crystal continuity of oxide superconductor layer b due to diffusion of Cu can also be prevented. As a result, in the case of using pure Ag for base material 38, a high Jc value of 100,000 A/cm² or more can be achieved.

In addition to diffusing elementary Cu in this diffusion layer c, alloys containing mainly Cu may also be used for the element diffused in diffusion layer c. For example, alloys in which Pt, Au, Pd, Ba, Y and so forth are added to Cu can also be used. This diffusion layer c can be formed using widely known deposition technology such as sputtering, vapor deposition and CVD, and there is no need to use sophisticated and expensive deposition technologies such as ion beam sputtering as in YSZ and so forth used for an intermediate layer in the prior art. In addition, since the use of an ordinary method such as sputtering or CVD allows the forming rate to be improved considerably, production can be carried out both easily and efficiently.

The layer thickness of the above diffusion layer is preferably within the range of 100 nm to 300 nm, and the content of Cu of diffusion layer c is preferably within the range of 50 μg/cm² to 300 μg/cm². If diffusion layer c is controlled to within these ranges, the crystal orientation and crystal continuity of oxide superconductor layer b can be improved, making it possible to provide an oxide superconductor having more superior superconductor characteristics. If the thickness of the above diffusion layer is less than 100 nm, or the Cu content is less than 50 μg/cm², the diffusion of Cu from the oxide superconductor layer cannot be prevented due to the inadequate amount of Cu contained in the diffusion layer, thereby making this undesirable. If the layer thickness exceeds 300 nm or the Cu content exceeds 300 μg/cm², the excess Cu reacts with the oxygen gas used when forming the oxide superconductor layer, resulting in the precipitation of oxides such as CuO, thereby making this undesirable.

Second Mode for Carrying Out the Present Invention

[Oxide Superconducting Conductor Base Material]

Figure 2A:
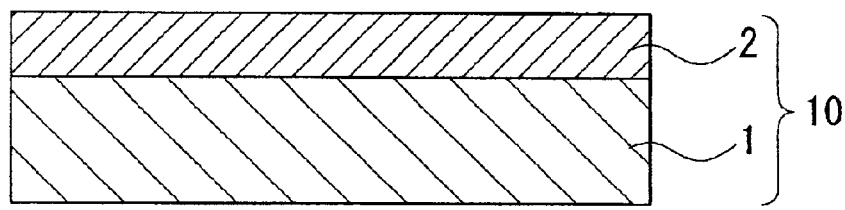
FIGS. 2A and 2B are drawings that show examples of the cross-sectional structure of an oxide superconducting conductor base material as claimed in a second mode for carrying out the present invention, with FIG. 2A indicating an example of a base material composed of a base metal and Ag foil, and FIG. 2B indicating an example having a barrier layer between the base metal and Ag foil.
Figure 2B:
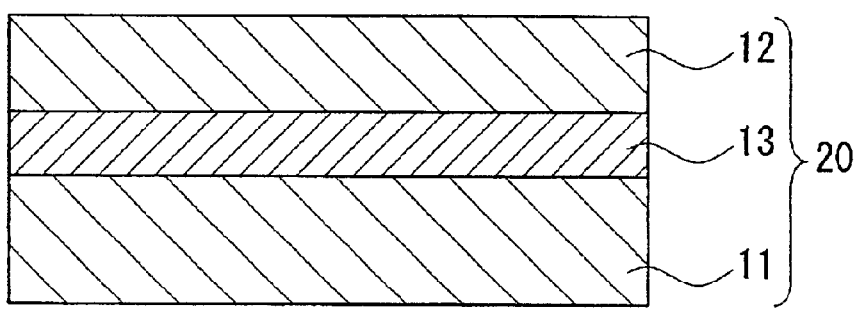

FIG. 2A is a drawing showing the cross-sectional structure of another mode for carrying out the present invention of the oxide superconducting conductor base material of the present invention, while FIG. 2B is a drawing showing another mode for carrying out the oxide superconducting conductor base material of the present invention. Oxide superconducting conductor base material 10 shown in FIG. 2A is composed of base metal 1 composed of a high-strength metal material, and Ag foil (Ag layer) 2 laminated on this base metal 1. Oxide superconducting conductor base material 20 shown in FIG. 2B is composed of base metal 11, barrier layer 13 formed on this base metal 11, and Ag foil (Ag layer) 12 laminated on this barrier layer 13. Furthermore, Although FIGS. 2A and 2B only show the cross-sectional structure of the oxide superconducting conductors, they are actually in the form of a tape that extends in a direction perpendicular to the page surface.

The above base metals 1 and 11 are preferably composed of a material having superior high-temperature strength such as hastelloy (NiCrMo alloy), Ni, inconel or stainless steel. The use of these metal materials for the base metal decreases susceptibility to the occurrence of softening of the base metal and diffusion of composite elements of the base metal in the case of heat treatment for converting the Ag layer to a texture or heating to a high temperature for deposition of the oxide superconductor layer. Thus, since a satisfactory texture can be formed and maintained for the Ag layer, and satisfactory crystal orientation and crystal continuity can be realized for the oxide superconductor layer, an oxide superconducting conductor can be produced having satisfactory superconductor characteristics. In addition, although the thickness of base metals 1 and 11 should be suitably altered according to the purpose, it should be within the range of about 50 μm to 200 μm.

Ag foils 2 and 12 are composed of Ag having a rolling texture. A {100}<001> texture having surface {100} for the surface of the base material and a cube texture in which <001> is preferentially oriented in the lengthwise direction, a {110}<110> texture having surface {110} for the surface of the base material and a cube texture in which <110> is preferentially oriented in the lengthwise direction, or a {110}<001> texture having surface {110} for the surface of the base material and a cube texture in which <001> is preferentially oriented in the lengthwise direction is preferable for the rolling texture of Ag foils 2 and 12. Since the use of an oriented Ag base material having these textures allows the crystal lattice constant of the surface of the base material to approach the lattice constant of the oxide superconductor layer particularly when forming a YBaCuO-based oxide superconductor layer, the crystallinity of the formed oxide superconductor layer can be improved, and superior superconductor characteristics can be provided.

In addition, the rolling texture of the above Ag foil 2 or 12 may be that which has been converted to a texture by performing heat treatment after laminating rolled Ag foil onto base metal 1 or barrier layer 13, or may be formed by performing heat treatment in advance on the rolled Ag foil to form a rolling texture in the Ag foil, and then laminating this Ag foil having a rolling texture on base metal 1 or barrier layer 13.

The film thickness of Ag foil 2 in base material 10 not provided with a barrier layer is within the range of 10 $\mu$m to 100 $\mu$m. If the film thickness of Ag foil 2 is less than 10 $\mu$m, the composite elements of base metal 1 pass through Ag foil 2 and diffuse in the oxide superconductor layer formed on Ag foil 2, thereby making this undesirable. In addition, if the film thickness exceeds 100 $\mu$m, the amount of Ag used becomes large which is not desirable due to increasing the cost of the base material.

On the other hand, in base material 20 provided with barrier layer 13, since diffusion of the elements of base metal 11 can be suppressed by this barrier layer 13, the film thickness of Ag foil 12 can be formed even thinner. Thus, the film thickness of Ag foil 12 is from 5 $\mu$m to 10 $\mu$m. If the film thickness of Ag foil 12 is less than 5 $\mu$m, it is difficult to laminate Ag foil 12 on barrier 13, thereby making this practically undesirable. In addition, if the film thickness exceeds 10 $\mu$m, there is an undesirable increase in the cost of the base material.

Barrier 13 shown in FIG. 2B is provided to prevent impairment of the crystal orientation of the Ag foil by preventing the diffusion of elements composing base metals 1 and 11 into the Ag foil due to heat treatment for forming the above rolling texture and heating to laminate the Ag foil on the base metal. Examples of materials that can be used to compose this barrier layer 13 include metals such as Pt, Au and Cu, and oxides such as MgO, YSZ (yttrium-stabilized zirconia) and $CeO_2$.

Although the film thickness of barrier layer 13 should be the suitably optimal film thickness according to the material that composes it, in the case of using a metal material, the film thickness is preferably about 0.2–0.5 $\mu$m, and in the case of using an oxide, the film thickness is preferably 0.1–0.2 $\mu$m. If barrier layer 13 composed with a metal material has a thickness of less than 0.2 $\mu$m, the effect of suppressing diffusion of the elements of base metal 11 are unable to be adequately obtained, while if the thickness exceeds 0.5 $\mu$m, barrier layer 13 is susceptible to peeling due to internal stress. In addition, if the film thickness of barrier layer 13 composed with an oxide is less than 0.1 $\mu$m, the effect of suppressing the diffusion of elements of base material 11 are again unable to be adequately obtained, while if the film thickness exceeds 0.2 $\mu$m, the amount of time required to form barrier layer 13 increases, which in addition to resulting in increased costs, results in the risk of the occurrence of cracks in barrier layer 13 due to the stress generated during bending of the base material.

According to oxide superconducting conductor base materials 10 and 20 composed in the manner described above, since Ag foils 2 and 12 are respectively formed on base metals 1 and 11 composed of a high-strength metal such as hastelloy, the base material strength, which was a problem with Ag base materials of the prior art, can be significantly improved, thereby facilitating application to materials such as wires. In addition, since the surface layers in the form of Ag foils 2 and 12 employ a structure having a rolling texture, matching with the lattice of the oxide superconductor layer formed on these Ag foils 2 and 12 is satisfactory, thereby enabling the composition of an oxide superconducting conductor having superior superconductor characteristics. In addition, use of the base materials 10 and 20 as claimed in the present invention allows the deposition of an oxide superconductor layer directly on Ag foils 2 and 12, thereby offering the additional advantages of simplifying the structure of the oxide superconducting conductor and facilitating production.

[Oxide Superconducting Conductor]

Figure 3A:
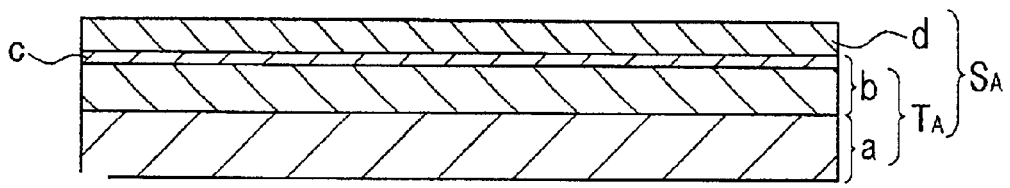
FIGS. 3A and 3B are drawings that show examples of the cross-sectional structure of an oxide superconducting conductor that can be produced according to the production method of an oxide superconducting conductor as claimed in a second mode for carrying out the present invention, with FIG. 3A showing an example of using a base material having the constitution shown in FIG. 2A, and FIG. 3B showing an example of using a base material having the constitution shown in FIG. 2B.

FIG. 3 shows examples of the cross-sectional structure of an oxide superconducting conductor as claimed in the present invention. Oxide superconducting conductor $S_A$ shown in FIG. 3A is an example of an oxide superconducting conductor that uses a base material of the constitution shown in FIG. 2A, and is composed to be provided with base metal a, base material $T_A$ comprised of Ag foil (Ag layer) b laminated on one side (upper side in the drawing) of this base metal a, and oxide superconductor layer d deposited on this base material $T_A$, wherein diffusion layer c, in which Cu is diffused in the Ag, is formed on the surface layer of Ag foil b of the above base material $T_A$, and oxide superconductor layer d is formed on this diffusion layer c.

In oxide superconducting conductor $S_A$ having the above constitution, the film thickness of Ag foil b is preferably from 10 $\mu$m to 100 $\mu$m. If the film thickness of Ag foil b is less than 10 $\mu$m, the composite elements of base metal a diffuse into oxide superconductor layer d through Ag foil b and cause a decrease in superconductor characteristics, thereby making this undesirable. In addition, if the film thickness exceeds 100 $\mu$m, the cost of the base material increases, thereby making this undesirable.

Figure 3B:
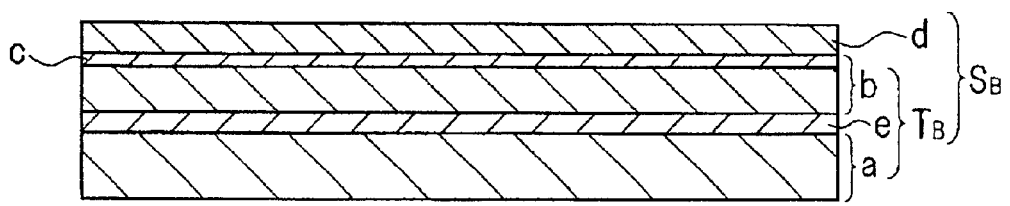

On the other hand, oxide superconducting conductor $S_B$ shown in FIG. 3B is an example of an oxide superconducting conductor that uses a base material of the constitution shown in FIG. 2B, and differs from oxide superconducting conductor $S_A$ shown in FIG. 3A with respect to the use of base material $T_B$ composed of base metal a, barrier layer e laminated onto one side (upper side in the drawing) of this base metal a, and Ag foil (Ag layer) b laminated onto this barrier layer e.

In the oxide superconducting conductor $S_B$ of the above constitution, the elements that compose base metal e can be prevented from diffusing into Ag foil b and oxide superconductor layer d on this Ag foil b by the above barrier layer e. Thus, according to the present constitution, an oxide superconductor layer d can be formed that has satisfactory crystal continuity even if Ag foil b is thin. In oxide superconducting conductor $S_B$ provided with this barrier layer e, if the film thickness of Ag foil b is less than 5 $\mu$m, it becomes difficult to laminate Ag foil b onto barrier layer e, thereby making this impractical. In addition, if the film thickness exceeds 10 $\mu$m, the cost of the base material increases, thereby making this undesirable.

In addition to diffusing elementary Cu in this diffusion layer c, alloys containing mainly Cu may also be used for the element diffused in diffusion layer c. For example, alloys in which Pt, Au, Pd, Ba, Y and so forth are added to Cu can also be used. This diffusion layer c can be formed using widely known deposition technology such as sputtering, vapor deposition and CVD, and there is no need to use sophisticated and expensive deposition technologies such as ion beam sputtering as in YSZ and so forth used for an intermediate layer in the prior art. In addition, since the use of an ordinary method such as sputtering or CVD allows the forming rate to be improved considerably, production can be carried out both easily and efficiently.

The layer thickness of the above diffusion layer is preferably within the range of 100 nm to 300 nm, and the content of Cu of diffusion layer c is preferably within the range of 50 $\mu g/cm^2$ to 300 $\mu g/cm^2$. If diffusion layer c is controlled to within these ranges, the crystal orientation and crystal continuity of oxide superconductor layer b can be improved, making it possible to provide an oxide superconductor having more superior superconductor characteristics. If the thickness of the above diffusion layer is less than 100 nm, or the Cu content is less than 50 $\mu g/cm^2$, the diffusion of Cu from the oxide superconductor layer cannot be prevented due to the inadequate amount of Cu contained in the diffusion layer, thereby making this undesirable. If the layer thickness exceeds 300 nm or the Cu content exceeds 300 $\mu g/cm^2$, the excess Cu reacts with the oxygen gas used when forming the oxide superconductor layer, resulting in the precipitation of oxides such as CuO, thereby making this undesirable.

As a result of being provided with a diffusion layer that is formed by diffusing Cu therein on the surface layer of Ag foil b of the base material, oxide superconducting conductors $S_A$ and $S_B$ of the above constitutions are able to prevent the diffusion of Cu contained in the oxide superconductor layer into Ag foil b, and in an oxide superconducting conductor in which an oxide superconductor layer is formed on an Ag foil, allows the realization of a high Jc value of 100,000 $A/cm^2$ or more. In addition, as a result of base materials $T_A$ and $T_B$ employing a two layer structure in which Ag layer b is formed on base metal a, an oxide superconducting conductor can be obtained that is provided with superior strength.

Third Mode for Carrying Out the Present Invention

Figure 4A:
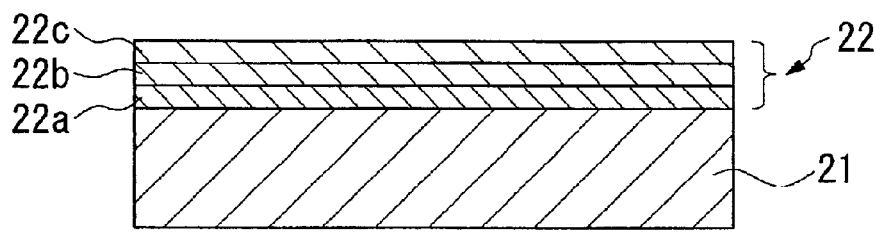
FIGS. 4A and 4B are drawings that show the cross-sectional structure of an oxide superconducting conductor as claimed in a third mode for carrying out the present invention, with FIG. 4A showing an example of forming an oxide superconductor layer directly on an Ag base material, and FIG. 4B showing an example of forming an oxide superconductor layer on an Ag layer formed on a base metal.
Figure 4B:
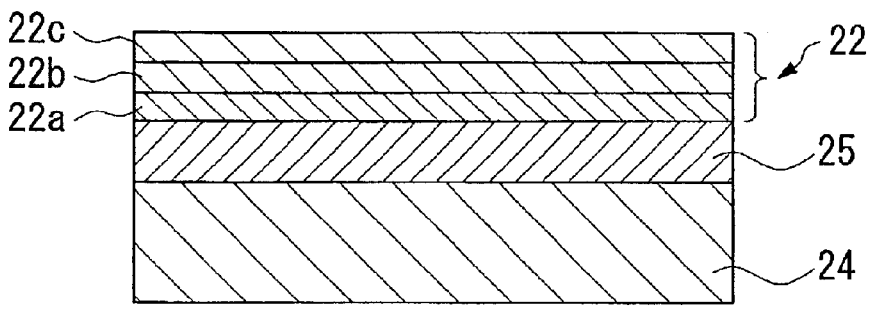

FIG. 4 is a cross-sectional structural drawing of an oxide superconducting conductor of a third mode for carrying out the present invention, with FIG. 4A showing an example of the structure in the case of using an Ag base material, and FIG. 4B showing an example of the structure in the case of using a base material in which an Ag layer is formed on a base metal.

The oxide superconducting conductor shown in FIG. 4A is composed by being provided with a base material 21 composed of Ag, and a first oxide superconductor layer 22a, second oxide superconductor layer 22b and third oxide superconductor layer 22c sequentially formed on this base material 21. The first oxide superconductor layer 22a is formed to have a higher Cu content than the other oxide superconductor layers 22b and 22c.

Although a long base material can be used for base material 21 shown in FIG. 4A, more particularly, the use of Ag oriented tape in which a rolling texture has been generated is preferable, and a diffusion layer in which Cu has been diffused may also be provided on the above oriented tape. Alternatively, that provided with an Ag film having a rolling texture on one or both sides of a base in the form of a tape such as metal tape may be used. Examples of materials that compose the above metal tape include silver, platinum, stainless steel, copper, hastelloy (e.g., C276) and other metal materials and alloys.

A {100}<001> texture having surface {100} for the surface of the base material and a cube texture in which <001> is preferentially oriented in the lengthwise direction, a {110}<110> texture having surface {110} for the surface of the base material and a cube texture in which <110> is preferentially oriented in the lengthwise direction, or a {110}<001> texture having surface {110} for the surface of the base material and a cube structure in which <001> is preferentially oriented in the lengthwise direction is preferable for the rolling texture of the above Ag. Since the use of an oriented Ag base material having these textures allows the crystal lattice constant of the surface of the base material to approach the lattice constant of the oxide superconductor layer particularly when forming a YBaCuO-based oxide superconductor layer, the crystallinity of the formed oxide superconductor layer can be improved, and superior superconductor characteristics can be provided.

A perovskite oxide superconductor represented with the structural formula $RE_1M_2Cu_3O_{7-x}$ (RE: 1 type selected from Y, La, Gd, Dy, Ho, Er, Tm, Yb, Nf, Sm and Eu, M: 1 type selected from Ba, Ca and Sr), a Bi system represented with the structural formula $Bi_2Sr_2Ca_{n-1}Cu_nO_{2n+2}$ (n is a natural number), or a Tl system represented with the structural formula $Tl_2Ba_2Ca_{n-1}Cu_nO_{2n+2}$ (n is a natural number) can be applied for oxide superconductor layers 22a–22c, and should be suitably selected according to the purpose. Among these oxide superconductors, the use of a Y-based oxide superconductor widely known with the composition of $Y_1Ba_2Cu_3O_{7-x}$ is preferable with respect to matching of the lattice with the Ag of the surface of base material 21.

On the other hand, the oxide superconducting conductor shown in FIG. 4B is composed provided with base metal 24, Ag layer 25 formed on base metal 24, and a first oxide superconductor layer 22a, second oxide superconductor layer 22b and third oxide superconductor layer 22c sequentially formed on Ag layer 25. The first oxide superconductor layer 22a is formed to have a higher Cu content than the other oxide superconductor layers 22b and 22c.

The above base metal 24 is preferably composed from a material having superior high-temperature strength such as hastelloy (NiCrMo alloy), Ni, inconel or stainless steel. The use of these metal materials for the base metal decreases susceptibility to the occurrence of softening of the base metal and diffusion of composite elements of the base metal in the case of heat treatment for converting the Ag layer to an texture or heating to a high temperature for deposition of the oxide superconductor layer. Thus, since a satisfactory texture can be formed and maintained for the Ag layer, and satisfactory crystal orientation and crystal continuity can be realized for the oxide superconductor layer, an oxide superconducting conductor can be produced having satisfactory superconductor characteristics. In addition, although the thickness of base metal 24 should be suitably altered according to the purpose, it should be within the range of about 50 $\mu$m to 200 $\mu$m.

Ag layer 25 is a layer composed of Ag having a rolling texture, and can be formed by laminating base metal 24 and roll-treated Ag foil. A {100}<001> texture having surface {100} for the surface of the base material and a cube texture in which <001> is preferentially oriented in the lengthwise direction, a {110}<110> texture having surface {110} for the surface of the base material and a cube texture in which <110> is preferentially oriented in the lengthwise direction, or a {110}<001> texture having surface {110} for the surface of the base material and a cube texture in which <001> is preferentially oriented in the lengthwise direction is preferable for this rolling texture. Since the use of an oriented Ag base material having these textures allows the crystal lattice constant of the surface of the base material to approach the lattice constant of the oxide superconductor layer particularly when forming a YBaCuO-based oxide superconductor layer, the crystallinity of the formed oxide superconductor layer can be improved, and superior superconductor characteristics can be provided.

In addition, the rolling texture of the above Ag layer 25 may be that which has been converted to an texture by performing heat treatment after laminating rolled Ag foil onto base metal 24, or may be formed by performing heat treatment in advance on the rolled Ag foil to form a rolling texture in the Ag foil, and then laminating this Ag foil having a rolling texture on base metal 24.

In the oxide superconducting conductor of the present mode for carrying out the present invention, since the Cu content of the first oxide superconductor layer 22c formed directly over an Ag base material or directly above an Ag layer is formed to be higher than the Cu content of the other oxide superconductor layers 22b and 22c, even if a portion of the Cu susceptible to diffusion into the Ag of the base material is diffused to the side of the base material, an extremely decrease in the Cu content of the first oxide superconductor layer 22a can be prevented, and the superconductor characteristics of the first oxide superconductor layer 22a can be made to be satisfactory. In addition, in the second and third oxide superconductor layers 22b and 22c formed on the first oxide superconductor layer 22a in this manner, since there is no occurrence of a decrease in the Cu content, and said layers can be formed having satisfactory crystallinity as a result of being formed on oxide superconductor layer 22a, superior superconductor characteristics can be obtained, and an oxide superconducting conductor can be obtained that is capable of realizing a high Jc value of 100,000 A/cm$^2$ or more.

In the oxide superconducting conductors shown in FIG. 4, the Cu content of the first oxide superconductor layer 22a is preferably within a range that is no more than 19% higher than the Cu content of the other oxide superconductor layers 22b and 22c. If the above difference in the Cu content exceeds 19%, the Cu content of the first oxide superconductor layer 22a becomes in excess, causing the occurrence of different phases such as CuO in the oxide superconductor layer, which is not desirable since it causes deterioration of superconductor characteristics.

Production Apparatus and Production Method of Oxide Superconducting Conductor

Next, an explanation is provided of two types of production apparatuses that can be used preferably in the production of an oxide superconducting conductor as claimed in the present invention shown in FIGS. 1 through 4, and a method for producing an oxide superconducting conductor using those respective production apparatuses.

[First Example of a Production Apparatus]

Figure 5:
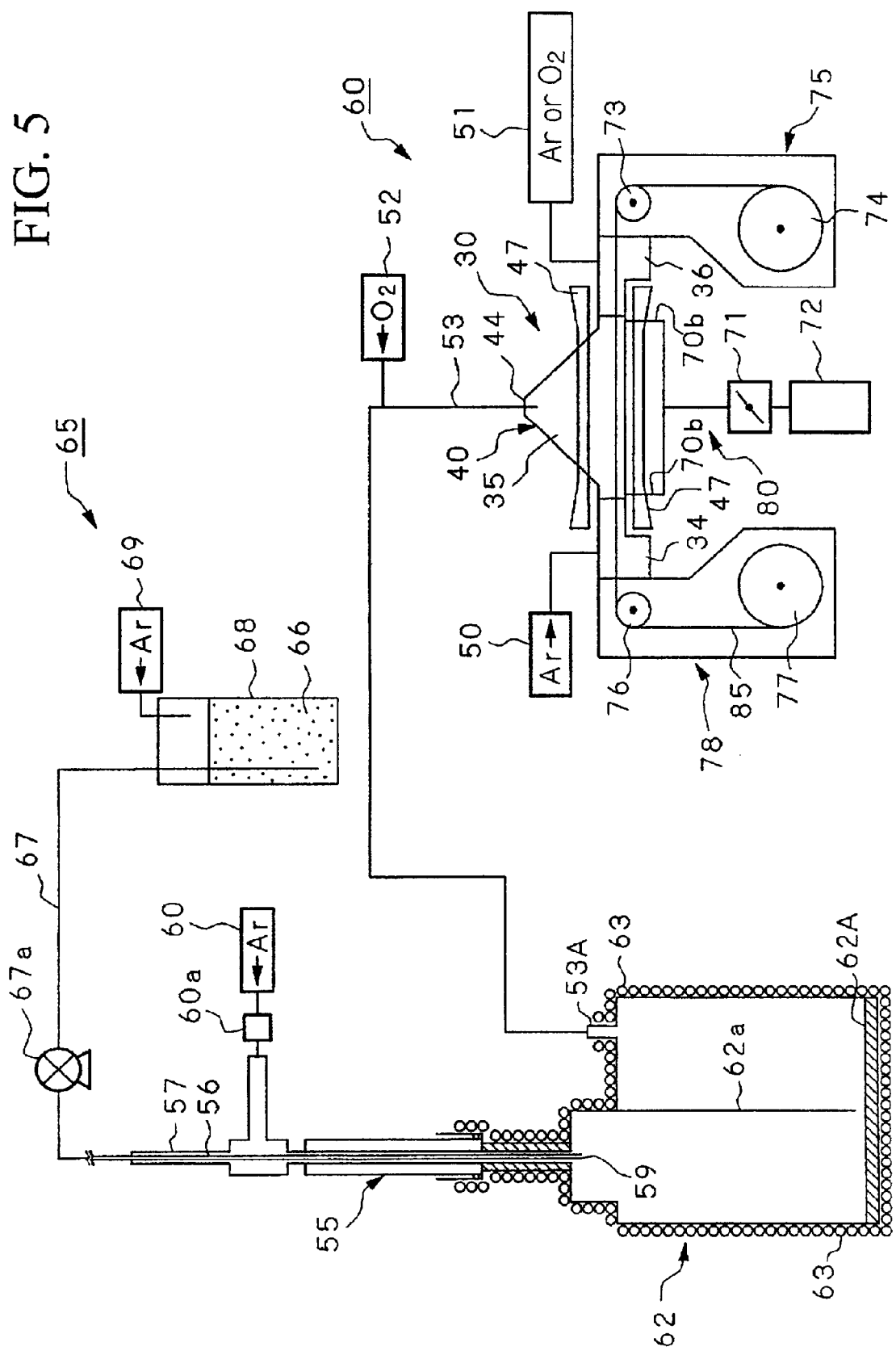
FIG. 5 is a block drawing showing a first example of a production apparatus of an oxide superconducting conductor as claimed in the present invention.

FIG. 5 shows a first example of a production apparatus of an oxide superconducting conductor as claimed in the present invention. CVD reaction apparatus 30, for which the structure is shown in FIG. 6, is incorporated in the production apparatus of this example, and an oxide superconductor layer is made to be formed on a base material in the form of a tape in this CVD reaction apparatus 30.

Figure 6:
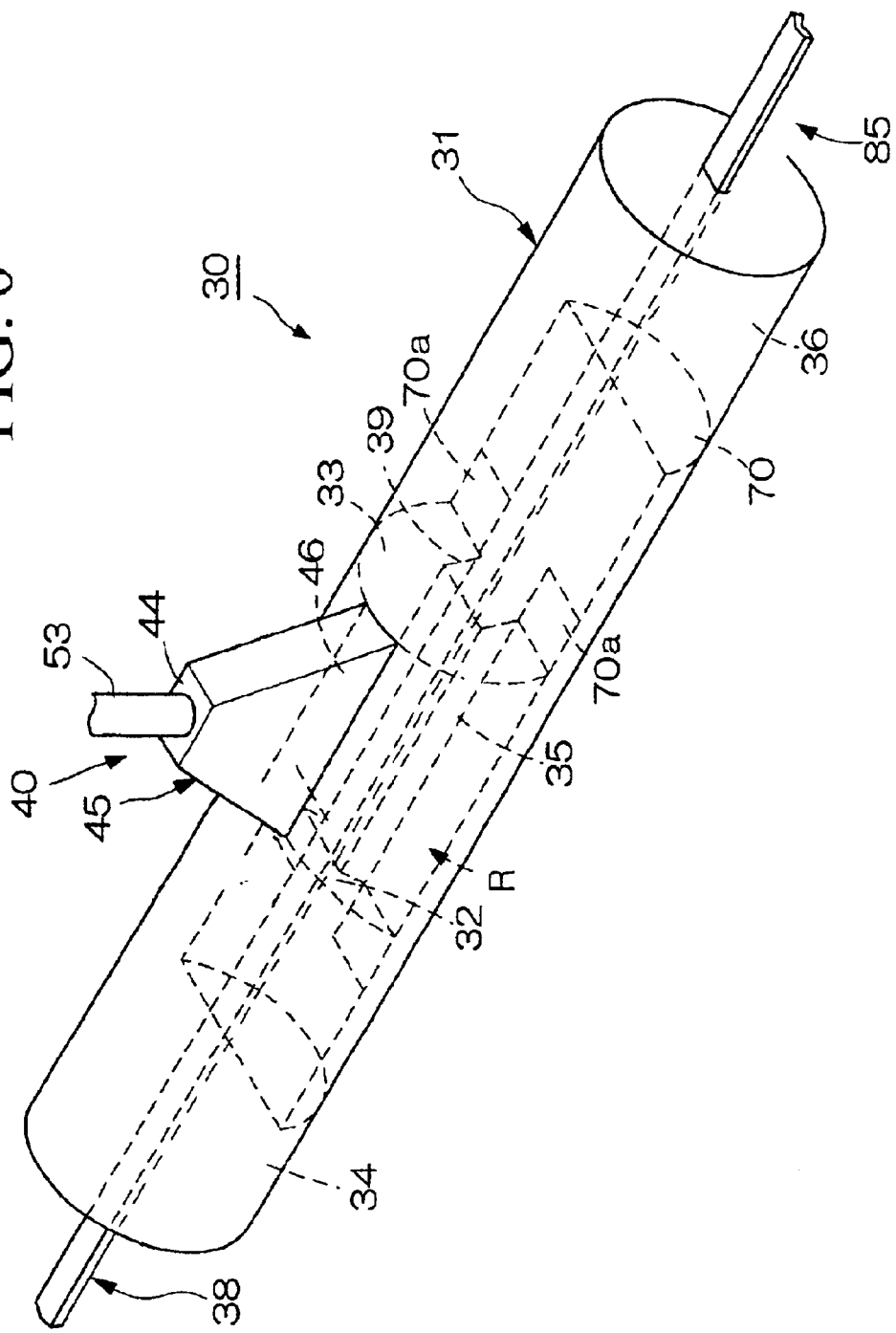
FIG. 6 is a perspective block drawing showing an example of the structure of a reactor provided in the production apparatus shown in FIG. 5.

As shown in FIGS. 5 and 6, CVD apparatus 30 used in this first example of a production apparatus has a horizontally long, cylindrical quartz reactor 31 of which both ends are closed, and gas diffusion section 40 that is connected to vaporizer (raw material gas supply source) 62 shown in FIG. 5. Reactor 31 shown in FIG. 6 is divided base material feed section 34, reaction generation chamber 35 and base material discharge section 36 in order starting from the left side of FIG. 6 by diaphragm 32 and diaphragm 33. The material that composes this reactor 31 is not limited to quartz, but may also be a metal having superior corrosion resistance such as stainless steel.

Through holes 39, through which base material 38 in the form of a long tape is able to pass, are respectively formed in the centers of the lower portions of diaphragms 32 and 33, and base material transport region R is formed within reactor 31 in a form that traverses the center. Moreover, a feedhole for feeding base material 38 in the form of a tape is formed in base material feed section 34, and a sealing mechanism (not shown) is provided in base material discharge section 36 that maintains base material feed section 34 and base material discharge section 36 in an airtight state by closing the gaps of each hole in the state in which base material 38 is passing through.

As shown in FIG. 6, a roughly truncated pyramidal gas diffusion section 40 is attached to the ceiling section of reaction generation chamber 35. This gas diffusion section 40 is composed provided with gas diffusion member 45 attached within reactor 31, gas feed tube 53 that is connected to ceiling wall 44 of gas diffusion member 45 and supplies oxide superconductor raw material gas to gas diffusion member 45, and a slit nozzle (not shown) provided on the end of gas feed tube 53. In addition, the inside of gas diffusion member 45 communicates with reaction generation chamber 35 at its bottom section.

On the other hand, as shown in FIG. 6, exhaust chamber 70 is provided below reaction generation chamber 35 along the lengthwise direction of base material transport region R. As shown in FIG. 6, long, narrow rectangular gas exhaust holes 70a are respectively formed in the upper sections of this exhaust chamber 70 on both sides of base material 38 within base material transport region R along the lengthwise direction of base material 38 in the form of a tape that has been passed through base material transport region R.

In addition, a plurality of exhaust tubes 70b connected to pressure regulation apparatus 72 provided with vacuum pump 71 shown in FIG. 5 are connected to the lower section of exhaust chamber 70. Thus, gas exhaust mechanism 80 is composed by exhaust chamber 70 in which gas exhaust holes 70a are formed, a plurality of gas exhaust tubes 70b, valves, vacuum pump 71 and pressure regulation apparatus 72. Gas exhaust mechanism 80 composed in this manner is able to rapidly evacuate raw material gas, oxygen gas, inert gas and other gases in CVD reaction apparatus 30 through gas exhaust holes 70a.

As shown in FIG. 5, heater 47 is provided outside of CVD reaction apparatus 30. In addition, the above base material feed section 34 is connected to inert gas supply source 50, while base material discharge section 36 is connected to oxygen gas supply source 51. Gas feed tube 53 connected to the ceiling wall 44 of gas diffusion section 40 is connected to vaporizer (supply source of raw material gas) 62. In addition, oxygen gas supply source 52 is branched and connected to the pathway of gas feed tube 53 through an oxygen gas flow regulating mechanism, and is composed so as to be able to supply oxygen gas into gas feed tube 53.

The end of a liquid raw material supply apparatus 55 to be described later (lower portion in the drawing) is housed in the above vaporizer 62. A heater 63 is additionally provided around vaporizer 62, and raw material solution 66 supplied from liquid raw material supply apparatus 55 is heated to a desired temperature and vaporized by this heater 63 to obtain a raw material gas.

In addition, heat retaining member 62A is installed on the inside bottom of vaporizer 62. This heat retaining member 62A may be made from any material provided it is a material having large heat capacity and does react with liquid raw material 66, a particularly preferable example of which is a thick metal plate, and examples of its composite material include stainless steel, hastelloy and inconel.

As shown in FIG. 5, liquid raw material supply apparatus 55 employs a two layer structure roughly composed of a tubular raw material solution supply section 56 and cylindrical carrier gas supply section 57 provided around the periphery of this supply section 56.

Raw material solution supply section 56 supplies raw material solution 66 transported from a bulk liquid supply apparatus 65 to be described later to the inside of vaporizer 62. Carrier gas supply section 57 is for providing the flow of a carrier gas for blowing the above-mentioned raw material solution 66 into the gap formed with raw material solution supply section 56. Carrier gas supply source 60 is connected to the upper portion of carrier gas supply section 57 through carrier gas MFC (metered flow controller) 60a, and is composed to be able to supply a carrier gas such as argon gas, helium gas or nitrogen gas to the inside of carrier gas supply section 57 (gap formed with raw material solution supply section 56).

In addition, the inside of vaporizer 62 is vertically divided into two compartments by divider 62a, the divided area communicates beneath divider 62a, and is composed so that raw material gas is able to pass through this communicating section beneath divider 62a and flow into connector 53A to which the previous gas feed tube 53 is connected.

In the above liquid raw material supply apparatus 55, when raw material solution 66 is fed into raw material solution supply section 56 at a constant flow rate together with carrier gas being fed into carrier gas supply section 57 at a constant flow rate, although raw material solution 66 reaches the end of raw material solution supply section 56, since carrier gas flows in from the end of carrier gas supply section 57 around the outside of this end, when carrier gas is blown out of end 59, raw material solution 66 is led inside vaporizer 62 together with the above carrier gas, and is heated and vaporized while moving through the inside of vaporizer 62 until it reaches the bottom, resulting in the formation of raw material gas. In addition, raw material solution 66 reaches heat retaining member 62A installed on the bottom of vaporizer 62 where it is further vaporized by this heat retaining member 62A resulting in a raw material gas in which the raw material solution has been completely vaporized. Furthermore, since the raw material gas is obtained in the structure of the present mode for carrying out the present invention by heat and mixing with a carrier gas instead of atomizing the raw material solution from the end of raw material solution supply section 56, with respect to vaporization of the liquid raw material, there is no collision with the inside walls of vaporizer 62 during the time until the liquid raw material is vaporized to a raw material gas, thereby making this constitution preferable.

Bulk liquid supply apparatus 65 is connected to raw material solution supply section 56 of this type of liquid raw material supply apparatus 55 through a connecting tube 67 equipped with a pressurized liquid pump 67a. Bulk liquid supply apparatus 65 is equipped with storage container 68 and purge gas source 69, and raw material solution 66 is housed in storage container 68. Raw material solution 66 is pumped to raw material solution supply section 56 by being aspirated by pressurized liquid pump 67a.

Moreover, as shown in FIG. 5, a base material transport mechanism 75 is provided on the lateral side (rear stage side) of base material discharge section 36 of CVD reaction apparatus 30 that consists of a tension drum 73 and winding drum 74 for winding up base material tape 38 that passes through base material transport region R within reaction 31. The above tension drum 73 and winding drum 74 are composed to as to be able to rotate freely in both the forward and reverse directions.

In addition, a base material transport mechanism 78 composed of a tension drum 76 and unwinding drum 77 is provided on the lateral side (front stage side) of base material feed section 34 for supplying base material tape 38 to CVD reaction apparatus 30. The above tension drum 76 and unwinding drum 77 are composed to as to be able to rotate freely in both the forward and reverse directions.

Next, an explanation is provided of the case of producing an oxide superconducting conductor shown in FIG. 1 by forming a diffusion layer and oxide superconductor layer on base material tape 38 using an oxide superconducting conductor production apparatus equipped with CVD reaction apparatus 30 composed in the manner described above.

In order to produce an oxide superconducting conductor using the production apparatus shown in FIGS. 5 and 6, base material tape 38 and raw material solutions for forming the diffusion layer and oxide superconductor layer are first prepared. A long base material made of the above material can be used for base material 38.

The raw material solution for generating a diffusion layer by a CVD reaction is preferably that in which a metal complex that composes the diffusion layer is dispersed in a solvent. More specifically, in the case of forming a diffusion layer composed of Cu, that in which $Cu(thd)_2$ or $Cu(DPM)_2$ and so forth is dissolved in a solvent such as tetrahydrofuran (THF), toluene, ispropanol or diglyme (2,5,8-trioxononane) can be used (thd=2,2,6,6-tetramethyl-3,5-heptanedione).

The raw material solution for generating the oxide superconductor by a CVD reaction is preferably that in which a metal complex that composes an oxide superconductor is dispersed in a solvent. More specifically, in the case of forming a Y-based oxide superconductor layer composed of $Y_1Ba_2Cu_3O_{7-x}$,
a metal complex such as
Ba-bis-2,2,6,6-tetramethyl-3,5-heptanedione-bis-1,10-phenan throline $(Ba(thd)_2phen_2)$, $Y(thd)_2$ or $Cu(thd)_2$ can be used, or
a metal complex such as
Y-bis-2,2,6,6-tetramethyl-3,5-heptanedionate $(Y(DPM)_3)$, $Ba(DPM)_2$ or $Cu(DPM)_2$ can be used.

Furthermore, since many kinds of oxide superconductor layers are known for the oxide superconductor layer in addition to the previous Y-based oxide superconductor layers such as an La system represented with the structural formula $La_{2-x}Ba_xCu_3O_4$, a Bi system represented with the structural formula $Bi_2Sr_2Ca_{n-1}Cu_nO_{2n+2}$ (n is a natural number), or a Tl system represented with the structural formula $Tl_2Ba_2Ca_{n-1}Cu_nO_{2n+2}$ (n is a natural number), the above CVD method should be carried out using a metal complex in accordance with the target composition.

Here, in the case of producing an oxide superconductor layer other than a Y-based oxide superconductor layer, for example, a metal complex such as triphenyl bismuth (III), bis(dipivaloimetite)strontium (II), bis(dipivaloimetite) calcium (II) or tris(dipivaloimetite)lanthanum (III) can be suitably used and supplied for production of an oxide superconductor layer of each respective system.

To begin with, raw material solution 66 in the form of the above raw material solution for the diffusion layer is housed in storage container 68 of bulk liquid supply apparatus 65, and connected to liquid raw material supply section 55. Once the above base material tape 38 has been prepared, in addition to this being fed at a prescribed movement speed from base material feed section 34 by base material transport mechanism 78 into base material transport region R inside reaction 31 of CVD reaction apparatus 30, it is wound up with winding drum 74 of base material transport mechanism 75, and base material 38 inside reaction generation chamber 35 is heated to a prescribed temperature with heater 47.

Furthermore, prior to feeding base material tape 38, it is preferable to eliminate air and other unnecessary gases inside CVD reaction apparatus 30 to keep the inside of CVD reaction apparatus 30 clean by feeding inert gas from inert gas supply source 50 into CVD reaction apparatus 30 in the form of purge gas, while simultaneously evacuating the gas inside CVD reaction apparatus 30 from gas exhaust holes 70a by pressure regulation apparatus 72.

Next, once base material tape 38 is fed into reactor 31, raw material solution 66 is pumped from storage container 68 by pressurized liquid pump 67a into raw material solution supply section 56 at a flow rate of about 0.1–10 ccm, and simultaneous to this, carrier gas is fed into carrier gas supply section 57 at a flow rate of about 200–550 ccm. In addition, vaporizer 62 is set to a temperature at which raw material solution 66 is sufficiently vaporized.

Whereupon, a mist of raw material solution 66 at a constant flow rate is continuously supplied to vaporizer 66, is heated by heater 63 and vaporized to become a raw material gas, and this raw material gas is continuously supplied to gas diffusion member 45 through gas feed tube 53.

Next, raw material gas that has moved towards reaction generation chamber 35 moves from the top to the bottom of reaction generation chamber 35, the above raw material gas reacts on heated base material 38, the reaction product accumulates thereon, and a diffusion layer is formed on base material 38. Base material 38 provided with this diffusion layer is then wound up on winding drum 74.

Once deposition has been carried out and a diffusion layer is formed on the base material to obtain the required length in the manner described above, raw material solution for forming an oxide superconductor layer is housed in storage container 68 of the previous raw material supply apparatus 65. The directions of rotation of winding drum 74 and unwinding drum 77 are reversed, and base material 38 is moved from base material discharge section 36 towards base material feed section 34.

Simultaneous to this, oxygen gas is fed from oxygen gas supply source 51 inside CVD reaction apparatus 30, and raw material solution 66 is pumped from storage container 68 by pressurized liquid pump 67a into raw material supply section 56 at a flow rate of about 0.1–10 ccm, and together with this, carrier gas is fed into carrier gas supply section 57 at a flow rate of about 200–550 ccm. In addition, the internal temperature of vaporizer 62 is adjusted by heater 63 so as to reach the optimum temperature of the raw material having the highest vaporization temperature among the above raw materials.

Whereupon, a mist of raw material solution 66 is continuously supplied into vaporizer 62 at a constant rate, heated by heater 63 and vaporized to become a raw material gas, and this raw material gas is then discharged from raw material gas discharge hole 53A, and continuously supplied to gas diffusion member 45 through gas feed tube 53.

Next, raw material gas that has moved towards reaction generation chamber 35 moves from the top to the bottom of reaction generation chamber 35, the above raw material gas reacts on heated base material 38, and the reaction product accumulates to obtain oxide superconducting conductor 85 provided with an oxide superconductor layer. Here, residual raw material gas and so forth that does not contribute to the reaction are drawn into gas exhaust holes 70a and rapidly discharged.

If an additional protective film comprised of silver and so forth is formed on the oxide superconducting conductor formed in the manner described above by sputtering, vapor deposition and so forth, oxide superconducting conductor S provided with the stabilizing layer a shown in FIG. 1 can be produced.

Furthermore, in an oxide superconducting conductor produced in the manner described above, after laminating the oxide superconductor layer, heat treatment may be carried out by heating for several hours to several tens of hours at a temperature of 300–500° C. in an oxygen atmosphere to align the crystal structure of the oxide superconductor layer and improve superconductor characteristics.

In oxide superconducting conductor S obtained according to the present production method, since oxide superconductor layer b having a suitable thickness is formed by using a suitable range for the transport speed of base material 38, coarsening of a axis oriented particles in this oxide superconductor layer can be suppressed, precipitation of phase components can be prevented, the effective current path can be enlarged, and critical current density can be increased. In addition, as a result of forming diffusion layer c, the diffusion of Cu from oxide superconductor layer b to base material 38 is suppressed, thereby resulting in an oxide superconducting conductor provided with superior superconductor characteristics.

[Second Example of a Production Apparatus]

Next, an explanation is provided of a second example of a production apparatus used in the case of producing oxide superconducting conductor S having the previous oxide superconductor layer b, and a production method that uses this production apparatus.

Figure 7:
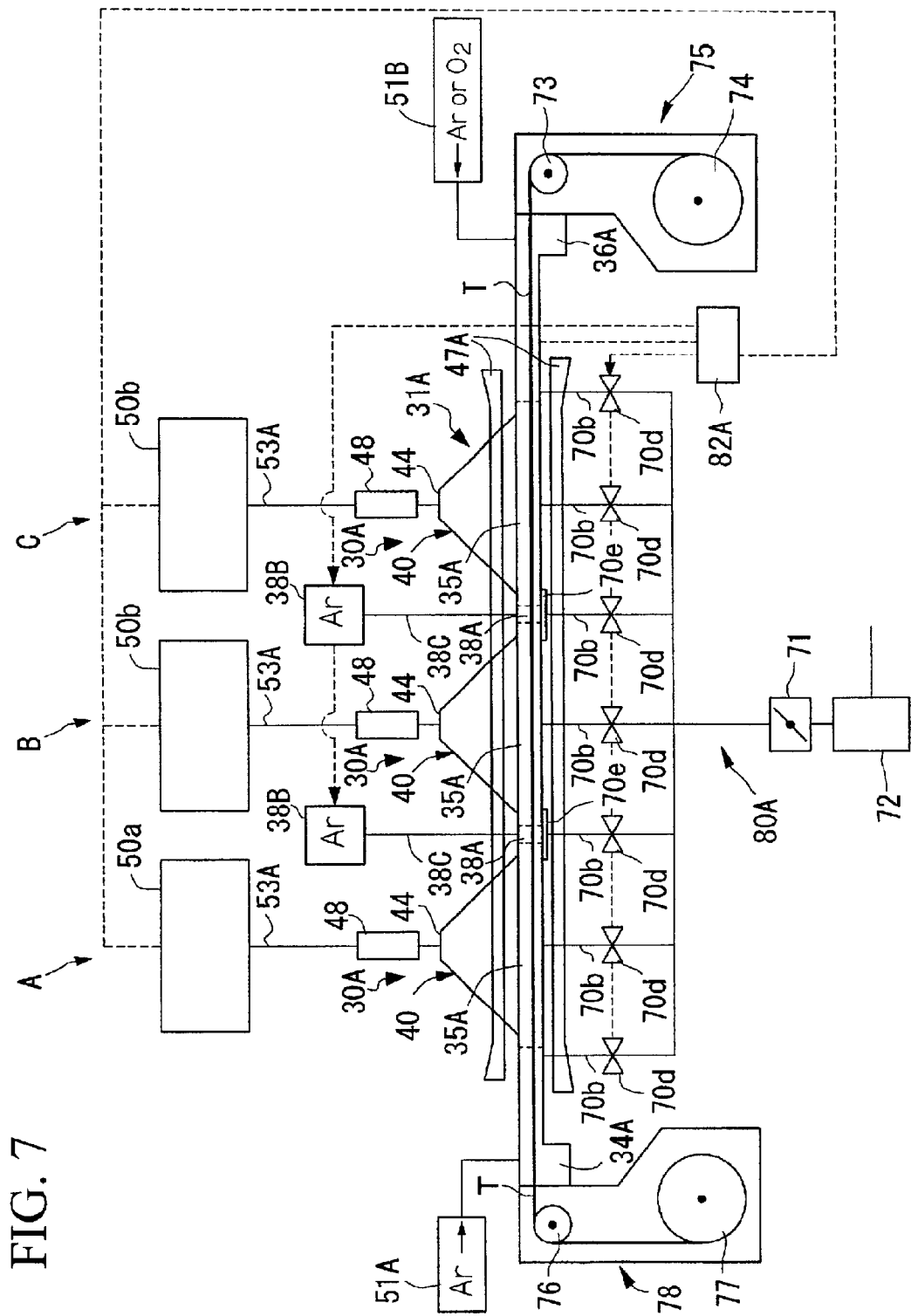
FIG. 7 is a drawing showing the overall constitution of a second example of a production apparatus of an oxide superconducting conductor as claimed in the present invention.
Figure 8:
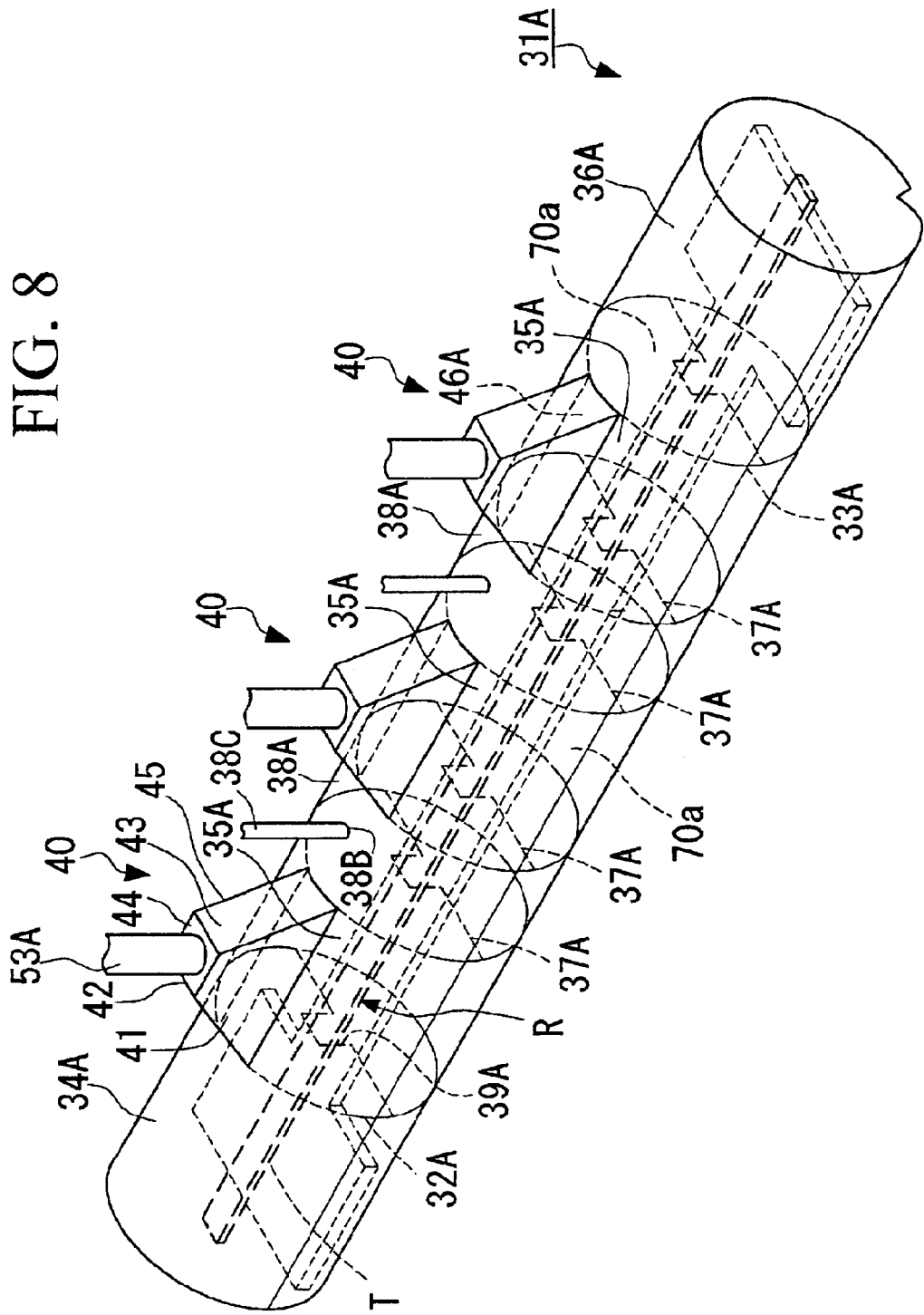
FIG. 8 is a perspective block drawing showing an example of the structure of a reactor provided in the production apparatus shown in FIG. 7.
Figure 9:
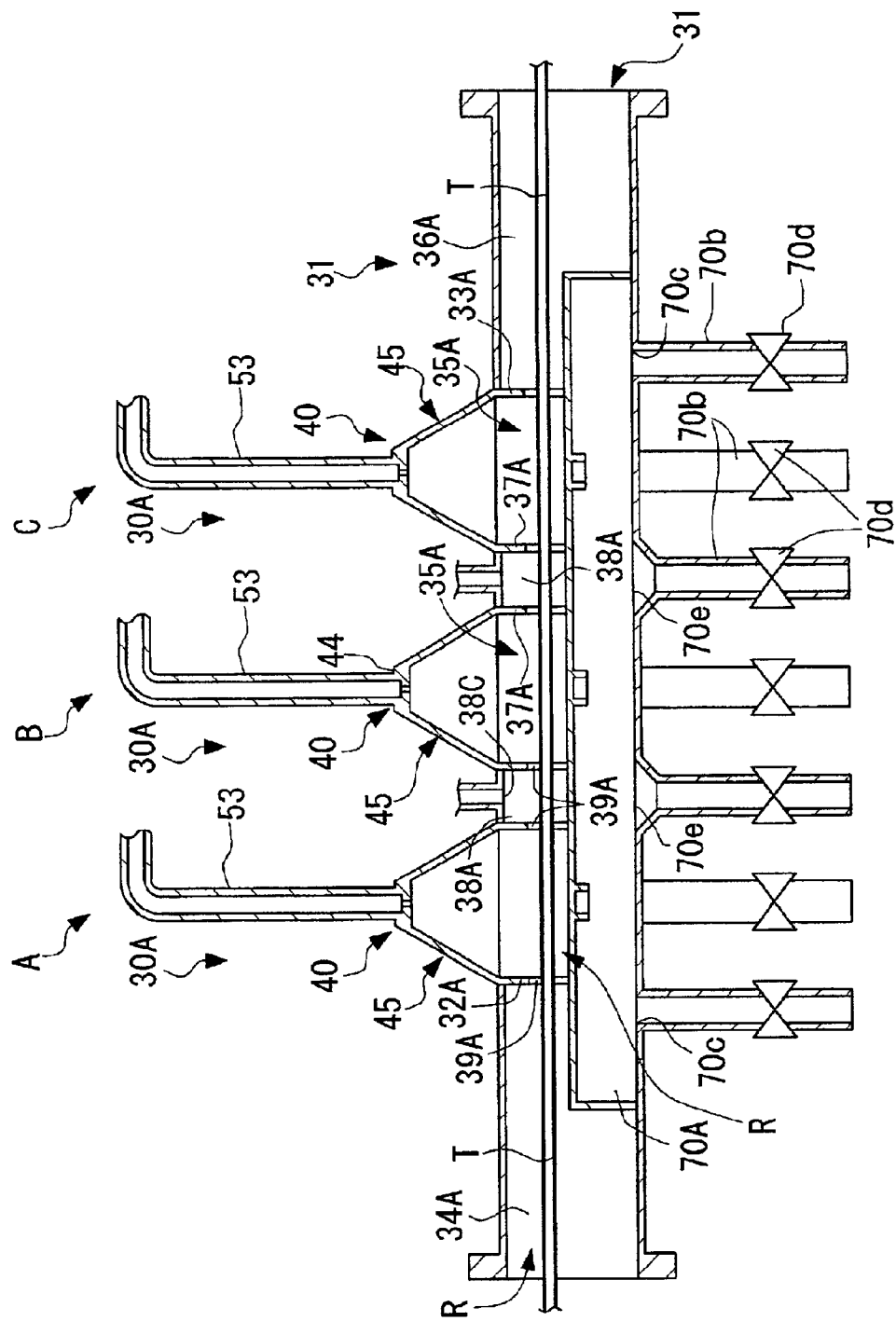
FIG. 9 is a cross-sectional block drawing showing an example of the structure of a reactor provided in the production apparatus shown in FIG. 7.

FIGS. 7 through 9 show a second example of a production apparatus of an oxide superconducting conductor as claimed in the present invention. This example of a production apparatus is incorporated with three CVD units A, B and C having roughly the same structures, and allows an oxide superconductor layer to be laminated and formed on at least one side of a base material in the form of a tape in reaction generation chamber 35A of each CVD reaction apparatus 30.

The production apparatus of an oxide superconducting conductor of the present mode for carrying out the present invention has a horizontally long, cylindrical quartz reactor 31A of which both ends are closed. As shown in FIG. 8, together with being divided into base material feed section 34A, reaction generation chamber 35A and base material discharge section 36A moving in order from the left side of FIG. 8 by diaphragms 32A and 33A, the above reaction generation chamber 35A is divided into a plurality of compartments (three compartments in the drawing) by a plurality of diaphragms 37A (four diaphragms are shown in the drawing), and together with each having a structure that is roughly the same as the previously described CVD reaction apparatus 30A, two boundary chambers 38A are partitioned between adjacent reaction generation chambers 35A (between adjacent diaphragms 37A). Thus, a plurality of reaction generation chambers 35A (three reaction generation chambers are shown in the drawing) are provided in series in the direction of movement of base material tape T that is fed in base material transport region R to be described later in this reactor 31A. Furthermore, the material that composes reactor 31A is not limited to quartz, but rather may be any metal having superior corrosion resistance such as stainless steel.

As shown in FIGS. 8 and 9, through holes 39A, through which base material T in the form of a long tape is able to pass, are respectively formed in the centers of the lower portions of the above diaphragms 32A, 37A, 37A, 37A, 37A and 33A, and base material transport region R is formed within reactor 31A in a form that traverses the center. Moreover, a feed hole for feeding base material tape T is formed in base material feed section 34A, and a base material discharge hole for discharging base material T is formed in base material discharge section 36A. In addition, a sealing mechanism (not shown) for maintaining base material feed section 34A and base material discharge section 36A in an airtight state by closing the gaps of each hole in the state in which base material 38 is passing through, is provided around the peripheral edges of the feed hole and discharge hole.

As shown in FIG. 8, a roughly truncated pyramidal gas diffusion section 40 is attached to the ceiling section of each reaction generation chamber 35A. This gas diffusion section 40 has the same structure as gas diffusion section 40 of the previously explained example. In addition, the bottom surface of gas diffusion member 45 is made to be in the form of narrow, long opening 46A, and gas diffusion member 45 communicates with reaction generation chamber 35A through this opening 46A.

In addition, as shown in FIGS. 7 and 8, in the ceiling portion of boundary chamber 38A, blocking gas supply means 38B is connected through feed tube 38C, and blocking gas supply means 38B supplies blocking gas for blocking corresponding reaction generation chambers 35A on both sides of boundary chamber 38A, while feed tube 38C is connected to boundary chamber 38A through a blocking gas blowing section. Argon gas, for example, is selected for this blocking gas.

On the other hand, as shown in FIG. 9, exhaust chamber 70A is provided below each reaction generation chamber 35A and boundary chamber 38A along the lengthwise direction of base material transport region R so as to penetrate each reaction generation chamber 35A and boundary chamber 38A. As shown in FIG. 8, long, narrow rectangular gas exhaust holes 70a are respectively formed in the upper sections of this exhaust chamber 70A on both sides of base material T along the lengthwise direction of base material tape T that has been passed through base material transport region R so as to penetrate each reaction generation chamber 35A and boundary chamber 38A, and both sides or ends of the base material transport region R of diaphragms 32A, 33A and 37A are in a state that penetrate these gas exhaust holes 70a.

In addition, a plurality of exhaust tubes 70b are respectively connected to the lower section of exhaust chamber 70A, and these exhaust tubes 70b are connected to a pressure regulation apparatus 72 provided with vacuum pump 71 shown in FIG. 7.

In addition, similar to the previous apparatus having the structure shown in FIG. 6, gas exhaust means 80A is composed of exhaust chamber 70A in which is formed gas exhaust holes 70a, a plurality of exhaust tubes 70b having exhaust holes 70c and 70e, a valve 70d, a vacuum pump 71 and a pressure regulation apparatus 72. Gas exhaust means 80A having this constitution is able to rapidly evacuate raw material gas, oxygen gas and inert gas within CVD reaction apparatus 30A as well as gases such as blocking gas.

As shown in FIG. 7, heater 47A is provided outside of reactor 31. In the example shown in FIG. 7, although heater 47A continuous across three reaction general chambers 35A, this heater 47A may also employ in independent structure for each reaction generation chamber 35A of each CVD reaction apparatus 30A.

Moreover, base material feed section 34A of reactor 31A is connected to inert gas supply source 51A, while base material discharge section 36A is connected to oxygen gas supply source 51B.

As shown in FIG. 7, each raw material gas feed tube 53A connected to ceiling wall 44 of gas diffusion section 40 provided in CVD unit A is connected to a raw material gas vaporizer (supply source of raw material gas) of diffusion layer raw material gas supply means 50a to be described later through a gas mixer 48 to be described later. In addition, each raw material gas tube 53A connected to ceiling wall 44 of each gas diffusion section 40 provided in CVD units B and C is connected to a raw material gas vaporizer (supply source of raw material gas) of oxide superconductor raw material gas supply means 50b.

The above diffusion layer raw material gas supply means 50a and oxide superconductor raw material gas supply means 50b are roughly composed to be provided with the previously explained bulk liquid supply apparatus 65 and liquid raw material supply apparatus 55 shown in FIG. 5, and a raw material solution vaporizing apparatus (raw material gas supply source) 62. Since other components are the same as the previous apparatus shown in FIGS. 5 and 6, the same reference symbols are assigned to those same components, and an explanation of those sections is omitted.

Next, an explanation is provided for the case of forming

Next, an explanation is provided of the case of producing an oxide superconducting conductor by forming a diffusion layer composed of Cu on base material tape T using an oxide superconducting conductor production apparatus having CVD units A, B and C composed in the manner described above, and forming an oxide superconductor layer on this diffusion layer.

In order to produce the oxide superconducting conductor shown in FIG. 1 using the production apparatus shown in FIGS. 7 through 9, base material tape T and raw material solutions for forming the diffusion layer and oxide superconductor layer are first prepared. A base material that is similar to the base material 38 used in the previous example is used for base material T. In addition, an apparatus similar to the previously explained apparatus can be used for the liquid raw material for generating an oxide superconducting conductor by a CVD reaction.

Once the above base material tape T has been prepared, in addition to this being fed at a prescribed movement speed from base material feed section 34A by base material transport mechanism 78 into base material transport region R inside the oxide superconducting conductor production apparatus, it is wound up with winding drum 74 of the base material transport mechanism. In addition, the method for feeding gas into the CVD reaction apparatuses 30 of CVD units A, B and C by each raw material gas supply means 50a may be the same as that of the previous example. As a result, base material T can be sequentially fed into the three reactors 31A, allowing the obtaining of an oxide superconducting conductor in which an oxide superconductor layer and diffusion layer are laminated on base material T.

Moreover, control means 82A independently controls the gas partial pressure for CVD units A, B and C, and controls raw material gas supply means 50a, 50b and 50b so as to maintain the prescribed gas partial pressure in each reaction generation chamber 35A. At this time, control means 82A preferably controls raw material gas supply means 50a, 50b and 50b so that the gas partial pressure of reaction generation chamber 35A downstream in the direction of movement from base material tape T is higher than the gas partial pressure of reaction generation chamber 35A in the direction of movement of base material tape T. Furthermore, following deposition of the oxide superconductor layer, heat treatment may be performed in order to align the crystal structure of the oxide superconductor thin film as necessary.

Finally, when a stabilizing layer comprised of silver and so forth is formed on oxide superconducting conductor S formed in the manner described above by sputtering or vapor deposition and so forth, the oxide superconducting conductor S provided with stabilizing layer a can be obtained as shown in FIG. 1. In addition, this stabilizing layer can also be formed by CVD in one or a plurality of the reaction generation chambers 35A of the production apparatus shown in FIGS. 7 through 9, and if composed in this manner, oxide superconducting conductors provided with a stabilizing layer can be produced continuously in the above production apparatus.

If the oxide superconducting conductor S shown in FIG. 1 is produced using an apparatus having the constitution shown in FIGS. 7 through 9, an oxide superconducting conductor provided with a diffusion layer and a stabilizing layer can be produced by a single movement of base material T. Even in the oxide superconducting conductor obtained in this example, since a diffusion layer and oxide superconductor layer of suitable thicknesses are laminated using a suitable range for the transport speed of base material T, an oxide superconducting conductor is obtained that is provided with superior superconductor characteristics as previously described.

Furthermore, an oxide superconducting conductor may also be produced using the apparatus shown in FIGS. 7 through 9 by repeatedly moving base material T back and forth between unwinding drum 77 and winding drum 74, and laminating a plurality of layers, such as 4 layers or 6 layers, of an oxide superconductor. In addition, although the explanation provided for the above example dealt with the case of forming a diffusion layer in the first stage (on the side of base material feed section 34A) reaction generation chamber 35A, and then forming oxide superconductor layers in the subsequent second and third stage reaction generation chambers 35A, the production method using the production apparatus of the present example is not limited to this method. For example, after completing deposition of a required length by forming first forming a diffusion layer on base material T while moving base material T in the state in which, for example, all three reaction generation chambers 35A are allocated for deposition of a diffusion layer, by then interchanging the raw material gas supply means so as to allow all three reaction generation chambers 35A to now deposit an oxide superconductor layer, and reversing the directions of rotation of unwinding drum 77 and winding drum 74 so that base material T moves from base material discharge section 36A towards base material feed section 34A, an oxide superconductor layer can be formed on a diffusion layer that has been formed on the above base material T.

In addition, in the production apparatuses of the previously described first and second examples, the oxide superconducting conductors shown in FIGS. 3A and 3B can also be produced. In this case, if base materials 10 and 20 shown in FIG. 2A or FIG. 2B are fed into the apparatus in the form of base material T to be used for deposition of an oxide superconductor layer, the oxide superconducting conductors shown in FIGS. 3A and 3B can be produced more easily than the production method described above.

Figure 10:
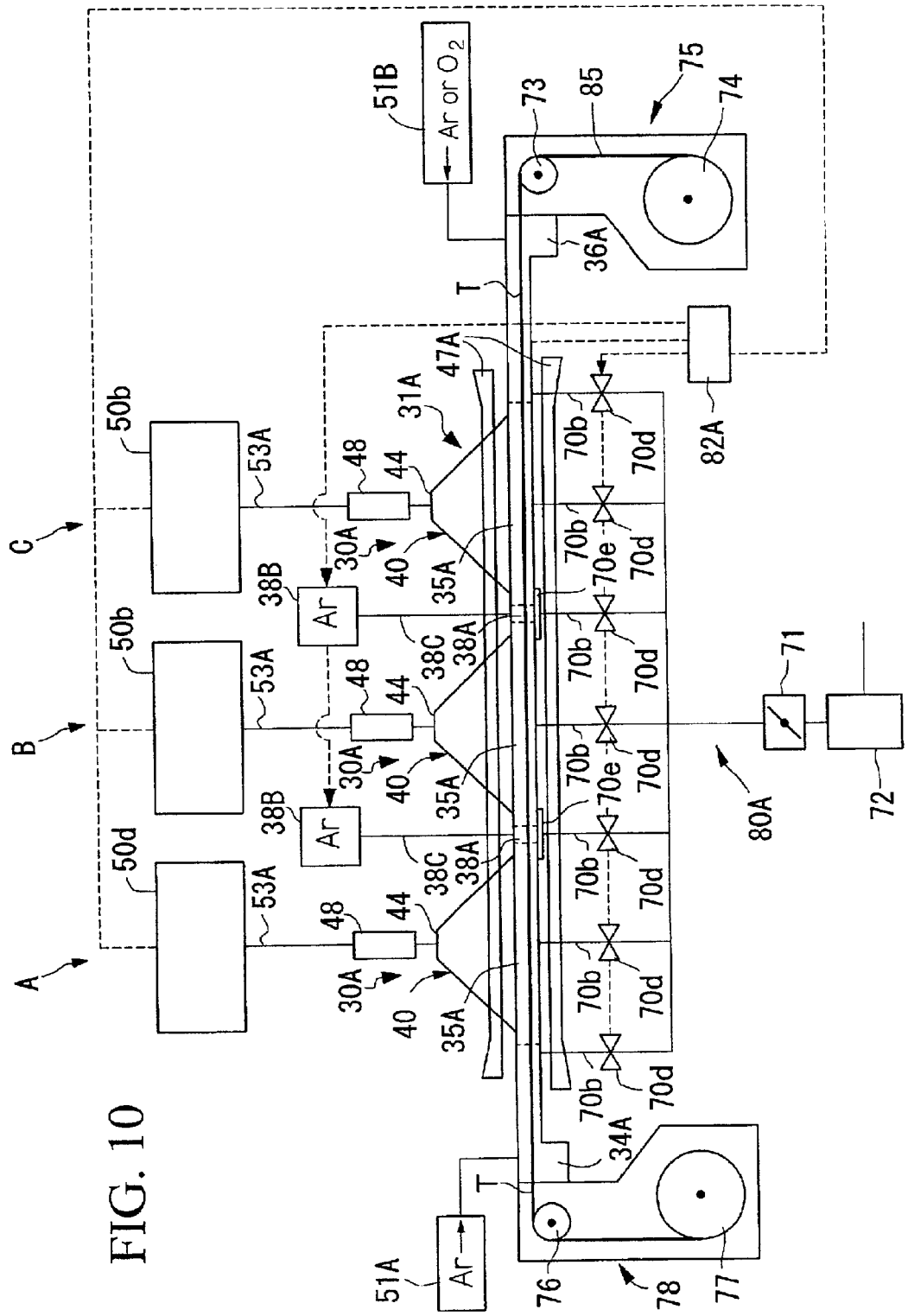
FIG. 10 is a cross-sectional block drawing showing an example of the constitution of a production apparatus in the case of producing an oxide superconducting conductor of the constitution shown in FIG. 4.
Figure 11:
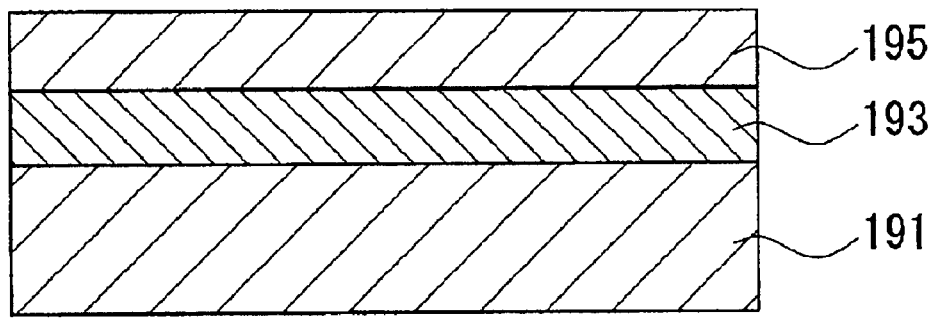
FIG. 11 is a cross-sectional drawing showing an example of an oxide superconducting conductor of the prior art.
Figure 12:
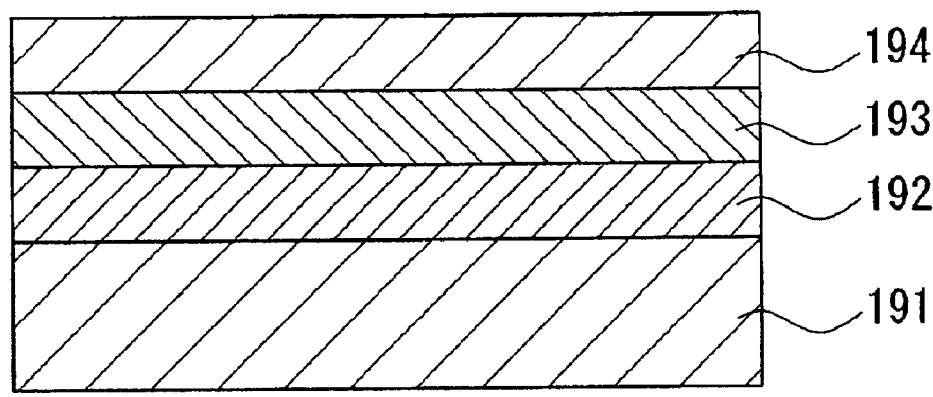
FIG. 12 is a cross-sectional drawing showing another example of an oxide superconducting conductor of the prior art.

Next, an explanation is provided of the case of applying the production apparatus having the constitution shown in FIGS. 7 through 9 to the production of the oxide superconducting conductor shown in FIG. 4. In order to produce the oxide superconducting conductor shown in FIG. 4 using these production apparatuses, a raw material gas supply means provided with a raw material solution for forming a first oxide superconductor layer 22a shown in FIG. 4 is used instead of the diffusion layer raw material gas supply means 50a shown in FIG. 8. The constitution of this raw material gas supply means is shown in FIG. 10. This raw material gas supply means is roughly composed by providing raw material gas supply means 50d with the raw material supply apparatus 65, liquid raw material supply means 55 and a raw material solution vaporizing apparatus (raw material gas supply source) 62 shown in FIG. 5, and a raw material solution for forming a first oxide superconductor layer is housed in storage container 68 of liquid raw material supply apparatus 55. In the producing of the oxide superconducting conductor shown in FIG. 4, apparatus components other than those described above can be applied without modification.

By then providing a base material formed in which Ag layer 25 is formed on base material 21 or base metal 24 shown in FIG. 4 for the reaction in the form of base material T using the production apparatus having the above constitution, oxide superconducting conductors can be produced as shown in FIGS. 4A and 4B. According to this production method, since an oxide superconductor layer can be produced by a single movement of base material T, and the range of the composition of the oxide superconductor layer directly above the Ag layer can still be properly controlled by diffusion of elementary Cu, not only the superconductor layer formed thereon, but also the entire superconductor layer, have superior superconductor characteristics. In addition, since an oxide superconductor layer of suitable thickness can be laminated by using a suitable range for the transport speed of base material T, an oxide superconducting conductor can be obtained that has even more superior superconductor characteristics.

Furthermore, in the present mode for carrying out the present invention, although the explanation has dealt with the case of using the production apparatuses shown in FIGS. 7 through 10 when producing the oxide superconducting conductors shown in FIGS. 3 and 4, these oxide superconducting conductors can also be easily produced using the production apparatus shown in FIGS. 5 and 6, and an oxide superconducting conductor can naturally also be produced that is provided with superior superconductor characteristics. In addition, an oxide superconducting conductor may also be produced using the apparatuses shown in FIGS. 7 through 10 by repeatedly moving base material T back and forth between unwinding drum 77 and winding drum 74, and laminating a plurality of layers, such as 4 layers or 6 layers, of an oxide superconductor.

In addition, in the case of producing the oxide superconducting conductor of the second mode for carrying out the present invention shown in FIG. 3 in the above example, although a diffusion layer is formed in reaction generation chamber 35A of a first stage (CVD unit A), followed by the formation of an oxide superconductor layer in the reaction generation chambers 35A of second and third stages (CVD units B and C), an oxide superconductor layer may also be formed on a diffusion layer formed on the above base material T by forming a diffusion layer on base material T while moving base material T in a state in which all three reaction generation chambers 35A are allocated to deposition of a diffusion layer, and after completing deposition of a required length, interchanging the raw material gas supply means so that now all three reaction generation chambers 35A are able to deposit an oxide superconductor layer, and reversing the directions of rotation of unwinding drum 77 and winding drum 74 so that base material T moves from base material discharge section 36A towards base material feed section 34A.

Although the following provides a more detailed explanation of the present invention through its embodiments, the present invention is not limited to the following embodiments.

EMBODIMENT 1

[Liquid Raw Materials and Base Material]

In the present embodiment, in order to clarify the effects brought about by providing a diffusion layer, an oxide superconducting conductor having the constitution shown in FIG. 1 was produced using an Ag(110) single crystal base material. The dimensions of the above base material were 10 mm (W)×50 mm (L)×0.3 mm (t).

To begin with, in order to form a Y-based oxide superconductor layer having the composition $Y_1Ba_2Cu_3O_{7-x}$, Ba-bis-2,2,6,6-tetramethyl-3,5-heptanedione-bis-1,10-phenan throline $(Ba(thd)_2(phen)_2)$, $Y(thd)_3$ and $Cu(thd)_2$ were used for the raw material solution for CVD. Each of these was mixed at a molar ratio of Y:Ba:Cu=1.0:3.0:2.7, and then added to tetrahydrofuran (THF) solvent to a concentration of 7.0 wt % to obtain the liquid raw material (raw material solution) of the oxide superconductor layer. In addition, $Cu(thd)_2$ was added to THF solvent to a concentration of 7.0 wt % to prepare the liquid raw material of the diffusion layer.

In this embodiment, for the production method using the production apparatus shown in FIGS. 7 through 9 for the production of an oxide superconducting conductor, a method was used for producing an oxide superconducting conductor by first forming a diffusion layer in which Cu is diffused on the surface layer of a base material using the above diffusion layer liquid raw material, and then depositing an oxide superconductor layer on this diffusion layer using the oxide superconductor liquid raw material.

[Deposition of Diffusion Layer]

The previous diffusion layer raw material solution was continuously supplied to the raw material solution supply section of the liquid raw material supply apparatus at a flow rate of 0.27 ml/min. by a pressurized liquid pump (pressurization source). Simultaneous to this, carrier gas in the form of Ar gas was fed to the carrier gas supply section at a flow rate of about 300 ccm. As a result of the above operation, a constant volume of liquid raw material mist was continuously supplied into the vaporizer, and the raw material gas resulting from vaporization of the liquid raw material was continuously supplied at a constant volume to the gas diffusion member of the CVD reaction apparatus through a gas feed tube. The temperature of the vaporizer and feed tube at this time was 230° C.

After setting the movement speed of the base material in the reactor when moved from the unwinding drum side to the winding drum side to 6.0 m/h, the base material heating temperature to 700° C., and the pressure in the reactor to 5.0 Torr (5.0×133 Pa), a Cu diffusion layer having a layer thickness of 200 nm was continuously formed on the surface layer of the base material, and deposited until movement of the base material for the prescribed length was completed. Furthermore, analysis of the Cu content of the surface layer of the base material on which this diffusion layer was formed yielded a Cu content of 100–200 μg per $cm^2$, which satisfied the requirements of the present invention.

[Deposition of Oxide Superconductor Layer]

Next, following completion of movement of the base material for the required length when moved from the unwinding drum side to the winding drum side, the above diffusion layer raw material solution was replaced with an oxide superconductor layer raw material solution. This oxide superconductor layer raw material solution was then continuously supplied to the raw material solution supply section of the liquid raw material supply apparatus by a pressurized liquid pump at a flow rate of 0.27 ml/min., and at the same time, carrier gas in the form of Ar gas was fed into the carrier gas supply section at a flow rate of about 300 ccm. As a result of the above operation, a constant volume of liquid raw material mist was continuously supplied into the vaporizer, and the raw material gas in which this liquid raw material was vaporized was continuously supplied in a constant amount to the gas diffusion member of the CVD reaction apparatus through a gas feed tube. The temperatures of the vaporizer and feed tube at this time were 230° C.

The directions of rotation of the unwinding drum and winding drum were then reversed, and after setting the movement speed of the base material in the reactor for moving the base material from the unwinding drum side to the winding drum side to 1.0 m/h, the base material heating temperature to 780° C., the pressure inside the reactor to 5.0 Torr (5.0×133 Pa), and the set oxygen partial pressure to 1.43–1.53 Torr (1.43×133–1.53×133 Pa), a YBaCuO-based oxide superconductor layer was continuously formed to a thickness of 0.78 μm on the moving base material followed by deposition until movement of the base material for the required length was completed.

An oxide superconducting conductor provided with a diffusion layer was obtained according to the above process. The production conditions of this oxide superconducting conductor of Embodiment 1 are shown in Table 2 below.

TABLE 2

|  | Metal intermediate layer (Cu) | Oxide superconductor layer (YBaCuO) |
| --- | --- | --- |
| Base material | Ag(110) single crystal | Same as at left |
| Base material transport conditions | 6.0 m/h | 1.0 m/h |
| Set synthesis temperature | 700° C. | 780° C. |
| Raw material composite ratio (Y:Ba:Cu) | 0:0:1.0 | 1.0:3.0:2.7 |
| Raw material solution concentration | 7.0 wt % | 7.0 wt % |
| Raw material supply rate | 0.27 ml/min. | 0.27 ml/min. |
| Reaction pressure | 5.0 Torr | 5.0 Torr |
| Set oxygen partial pressure | — | 1.43–1.53 Torr |

COMPARATIVE EXAMPLE 1

An oxide superconducting conductor was produced in the same manner as the above Embodiment 1 using the same oxide superconductor layer raw material solution, base material and so forth as the previously indicated CVD apparatus with the exception of not depositing a diffusion layer.

[Analysis and Evaluation]

Next, the oxide superconducting conductors of Embodiment 1 and Comparative Example 1 obtained in the manner described above were evaluated for their superconductor characteristics. Those results are shown in Table 3. As shown in Table 3, in the case of forming on an Ag(110) single crystal base material, the oxide superconducting conductor of Embodiment 1 was confirmed to allow the obtaining of a Jc value of 340,000 A/cm$^2$, which was greater by a factor of 10 than the Jc value of 30,000 A/cm$^2$ of the oxide superconducting conductor of Comparative Example 1.

TABLE 3

| Sample 10 mm(W) × 50 mm(L) × 0.3 mm(t) | Oxide superconductor layer thickness (μm) | In-plane orientation* (°) | Ic (A)** | Jc (A/cm$^2$)** |
|---|---|---|---|---|
| Embodiment 1 | 0.78 | 8.5–9.0 | 26.3 | 3.4 × 10$^5$ |
| Comp. Ex. 1 | 0.87 | 5.6–7.0 | 2.58 | 3.0 × 10$^4$ |

*The full width at half maximum (FWHM) value of YBaCuO (103) was measured for the in-plane orientation.
**Ic and Jc values were measured under conditions of 1 μV, 77 K and 0 T.

In the case of using Ag(110) single crystal for the base material, there was hardly any effect on the oxide superconductor layer by the Ag crystal grain boundary, and was considered to be negligible. Thus, the reason for the significant improvement in the Jc value of the oxide superconducting conductor of Embodiment 1 that was laminated with a diffusion layer is presumed to be the significant improvement in crystal orientation of the oxide superconductor layer resulting from diminished diffusion of Cu from the YBaCuO film serving as the oxide superconductor layer into the Ag base material.

EMBODIMENT 2

Next, the effect of the diffusion layer as claimed in the present invention was verified using a {110}<110> textured Ag base material.

Normally, in order to obtain an Ag{110}<110> texture, it is necessary to perform heat treatment for several hours at 800–900° C. on an Ag base material in the form of a tape that has been subjected to constant pressure rolling, and as a result of this heat treatment for conversion to a texture and heating to deposit the oxide superconductor layer, the Ag grain boundary grows, which is thought to impair the smoothness of the Ag base material surface.

In other words, in the case of producing an oxide superconducting conductor by forming an oxide superconductor layer on an Ag base material having a {110}<110> texture, there is the possibility of a considerable change in superconductor characteristics depending on the conditions of heat treatment for converting the Ag base material to a texture. Thus, in the present embodiment, oxide superconducting conductors were produced by varying the conditions of heat treatment for obtaining an Ag{110}<110> texture as well as the conditions for depositing the diffusion layer, followed by an evaluation of their superconductor characteristics.

The following indicates the production processes of four types of oxide superconducting conductors designated as samples A through D produced in the present embodiment. Samples A and B were produced by performing texture heat treatment in air and in an argon atmosphere, respectively, without depositing a diffusion layer. Although Samples C and D were both produced by performing texture conversion heat treatment in an argon atmosphere and depositing a diffusion layer, Sample C was produced by first depositing the diffusion layer prior to texture conversion heat treatment, while Sample D was produced by depositing the diffusion layer after performing texture conversion heat treatment.

[Sample A]

Step 1: Texture conversion heat treatment (800–900° C. for several tens of minutes to several hours in air)

Step 2: Deposition of oxide superconductor layer (deposition temperature: 700–800° C.)

[Sample B]

Step 1: Texture conversion heat treatment (several tens of minutes to several hours at 800–900° C. in argon gas)

Step 2: Deposition of oxide superconductor layer (deposition temperature: 700–800° C.)

[Sample C]

Step 1: Deposition of diffusion layer (deposition temperature: 700° C.)

Step 2: Texture conversion heat treatment (several tens of minutes to several hours at 800–900° C. in argon gas)

Step 3: Deposition of oxide superconductor layer (deposition temperature: 700–800° C.)

[Sample D]

Step 1: Texture conversion heat treatment (several tens of minutes to several hours at 800–900° C. in argon gas)

Step 2: Deposition of diffusion layer (deposition temperature: 700° C.)

Step 3: Deposition of oxide superconductor layer (deposition temperature: 700–800° C.)

With respect to production conditions other than the above conditions in the present embodiment, the conditions shown in Table 2 were used for the deposition conditions of the oxide superconductor layer for samples A and B, while the same conditions shown in Table 2 were used for the deposition conditions of both the diffusion layer and oxide superconductor layer for Samples C and D.

[Analysis and Evaluation]

The oxide superconducting conductors of samples A through D prepared in the manner described above were evaluated for their superconductor characteristics. Those results are shown in Table 4. As shown in Table 4, the Jc values of the oxide superconducting conductors of Samples C and D that were deposited with a diffusion layer were 200,000 A/cm2 or more, and were confirmed to demonstrate a considerably improvement in Jc values as compared with Samples A and B having Jc values on the order of about 30,000 A/cm2. In addition, among these Samples C and D, Sample C, in which the diffusion layer was deposited prior to texture conversion heat treatment, exhibited a higher Jc value than Sample D. On the basis of these results, the formation of a diffusion layer was confirmed to considerably improve superconductor characteristics. The reason for Sample C, in which diffusion layer deposition was carried out prior to texture conversion heat treatment, demonstrating a larger Jc value is thought to be due to the smoothness of the base material surface being maintained as a result of Ag grain boundary growth being inhibited due to the surface of the Ag material being covered with the diffusion layer.

TABLE 4

| Sample 5 mm(W) × 20 mm(L) × 0.2 mm(t) | Oxide superconduct or layer thickness ($\mu$m) | In-plane orientation* (°) | Ic (A)** | Jc (A/cm$^2$)** |
|---|---|---|---|---|
| Sample A | 0.85 | 15–20 | 1.26 | $3.0 \times 10^4$ |
| Sample B | 0.83 | 14–19 | 1.55 | $3.7 \times 10^4$ |
| Sample C | 0.80 | 15–18 | 9.05 | $2.3 \times 10^5$ |
| Sample D | 0.82 | 14–17 | 8.43 | $2.1 \times 10^5$ |

*The full width at half maximum (FWHM) value of YBaCuO (103) was measured for the in-plane orientation.
**Ic and Jc values were measured under conditions of 1 $\mu$V, 77 K and 0 T.

On the other hand, in the oxide superconducting conductors of Samples A and B in which a diffusion layer was not deposited, Sample B, for which texture conversion heat treatment was performed in an argon atmosphere, demonstrated a higher Jc value. Since the crystal orientations of these Samples A and B were the same, it is presumed that the performing of texture conversion heat treatment in an argon atmosphere made it possible to suppress grain boundary growth on the surface of the Ag base material.

EMBODIMENT 3

[Liquid Raw Materials and Base Material]

In the present embodiment, the oxide superconducting conductor shown in FIG. 3A was produced using the base material shown in FIG. 2A. More specifically, an oxide superconducting conductor was produced using hastelloy tape for the base metal, and a base material in which Ag foil in which a {110}<110> texture was formed was laminated onto this base metal. In addition, in the present embodiment, two types of base materials were used in which Ag foils having thicknesses of 10 $\mu$m and 50 $\mu$m were laminated onto a base metal having dimensions of 10 mm(W)×50 mm(L)× 0.09 mm(t). Furthermore, although Ag foil in which an texture had already been formed was used for the Ag foil in the present embodiment, Ag rolled foil may also be laminated onto the base metal followed by heat treatment to form an texture.

To begin with, in order to form a Y-based oxide superconductor layer having the composition $Y_1Ba_2Cu_3O_{7-x}$, Ba-bis-2,2,6,6-tetramethyl-3,5-heptanedione-bis-1,10-phenan throline (Ba(thd)$_2$(phen)$_2$), Y(thd)$_2$ and Cu(thd)$_2$ were used for the raw material solution for CVD. Each of these was mixed at a molar ratio of Y:Ba:Cu=1.0:3.0:2.7, and then added to tetrahydrofuran (THF) solvent to a concentration of 7.0 wt % to obtain the liquid raw material (raw material solution) of the oxide superconductor layer. In addition, Cu(thd)$_2$ was added to THF solvent to a concentration of 7.0 wt % to prepare the liquid raw material of the diffusion layer.

In this embodiment, for the production method using the production apparatus shown in FIGS. 7 through 9 for the production of an oxide superconducting conductor, a method was used for producing an oxide superconducting conductor by first forming a diffusion layer in which Cu is diffused on the surface layer of a base material using the above diffusion layer liquid raw material, and then depositing an oxide superconductor layer on this diffusion layer using the oxide superconductor liquid raw material.

[Deposition of Diffusion Layer]

The previous diffusion layer raw material solution was continuously supplied to the raw material solution supply section of the liquid raw material supply apparatus at a flow rate of 0.27 ml/min. by a pressurized liquid pump (pressurization source). Simultaneous to this, carrier gas in the form of Ar gas was fed to the carrier gas supply section at a flow rate of about 300 ccm. As a result of the above operation, a constant volume of liquid raw material mist was continuously supplied into the vaporizer, and the raw material gas resulting from vaporization of the liquid raw material was continuously supplied at a constant volume to the gas diffusion member of the CVD reaction apparatus through a gas feed tube. The temperature of the vaporizer and feed tube at this time was 230° C.

After setting the movement speed of the base material in the reactor when moved from the unwinding drum side to the winding drum side to 6.0 m/h, the base material heating temperature to 700° C., and the pressure in the reactor to 5.0 Torr (5.0×133 Pa), a Cu diffusion layer having a layer thickness of 200 nm was continuously formed on the surface layer of the base material, and deposited until movement of the base material for the prescribed length was completed. Furthermore, analysis of the Cu content of the surface layer of the base material on which this diffusion layer was formed yielded a Cu content of 100–200 $\mu$g per cm.

[Deposition of Oxide Superconductor Layer]

Next, following completion of movement of the base material for the required length when moved from the unwinding drum side to the winding drum side, the above diffusion layer raw material solution was replaced with an oxide superconductor layer raw material solution. This oxide superconductor layer raw material solution was then continuously supplied to the raw material solution supply section of the liquid raw material supply apparatus by a pressurized liquid pump at a flow rate of 0.27 ml/min., and at the same time, carrier gas in the form of Ar gas was fed into the carrier gas supply section at a flow rate of about 300 ccm. As a result of the above operation, a constant volume of liquid raw material mist was continuously supplied into the vaporizer, and the raw material gas in which this liquid raw material was vaporized was continuously supplied in a constant amount to the gas diffusion member of the CVD reaction apparatus through a gas feed tube. The temperatures of the vaporizer and feed tube at this time were 230° C.

The directions of rotation of the unwinding drum and winding drum were then reversed, and after setting the movement speed of the base material in the reactor for moving the base material from the unwinding drum side to the winding drum side to 1.0 m/h, the base material heating temperature to 780° C., the pressure inside the reactor to 5.0 Torr (5.0×133 Pa), and the set oxygen partial pressure to 1.43–1.53 Torr (1.43×133–1.53×133 Pa), a YBaCuO-based oxide superconductor layer was continuously formed on the moving base material followed by deposition until movement of the base material for the required length was completed.

An oxide superconducting conductor provided with a diffusion layer was obtained according to the above process. The production conditions of this oxide superconducting conductor of Embodiment 3 are shown in Table 5 below.

TABLE 5

| | Base material condition | |
|---|---|---|
| Base metal | Hastelloy tape (10(W) × 50(L) × 0.09(t) mm | |
| Ag foil | {110}<110> texture (0.01(t) mm/0.05(t) mm | |
| | Synthesis conditions | |
| | Metal intermediate layer (Cu) | Oxide superconductor layer (YBaCuO) |
| Base material transport conditions | 6.0 m/h | 1.0 m/h |
| Set synthesis temperature | 700° C. | 780° C. |

TABLE 5-continued

| Raw material composite ratio (Y:Ba:Cu) | 0:0:1.0 | 1.0:3.0:2.7 |
|---|---|---|
| Raw material solution concentration | 7.0 wt % | 7.0 wt % |
| Raw material supply rate | 0.27 ml/min. | 0.27 ml/min. |
| Reaction pressure | 5.0 Torr | 5.0 Torr |
| Set oxygen partial pressure | — | 1.43–1.53 Torr |

[Analysis and Evaluation]

Superconductor characteristics were evaluated for the two types of oxide superconducting conductors obtained above by designating that in which the thickness of the Ag foil was 10 μm as Sample E, and designating that in which the thickness of the Ag foil was 50 μm as Sample F. Those results are shown in Table 6. As shown in Table 6, in the case of using a base material in which an Ag foil was laminated directly onto a base metal without providing a barrier layer, although the Jc value of the oxide superconducting conductor of Sample E in which the thickness of the Ag foil was 50 μm was 130,000 A/cm$^2$, the Jc value of the oxide superconducting conductor of Sample F in which the thickness of the Ag foil was 10 μm was 32,000 A/cm$^2$. This difference in Jc values is thought to be the result of the diffused composite elements of the hastelloy (Ni, Cr, Mo, etc.) having reached the oxide superconductor layer by passing through the Ag foil when the thickness of the Ag foil was 10 μm, thereby causing deterioration of superconductor characteristics.

TABLE 6

| Sample 10 mm (W) × 50 mm (L) | Ag foil thickness (μm) | Oxide superconductor layer thickness (μm) | In-plane orientation* (°) | Ic (A)** | Jc (A/cm$^2$)** |
|---|---|---|---|---|---|
| Sample E | 10 | 0.82 | 14–19 | 2.66 | 3.2 × 10$^4$ |
| Sample F | 50 | 0.78 | 15–19 | 10.5 | 1.3 × 10$^5$ |

*The full width at half maximum (FWHM) value of YBaCuO (103) was measured for the in-plane orientation.
**Ic and Jc values were measured under conditions of 1 μV 77 K and 0 T.

EMBODIMENT 4

Next, the oxide superconducting conductor shown in FIG. 3B was produced using the base material shown in FIG. 2B. More specifically, an oxide superconducting conductor was produced using a base material having a constitution in which hastelloy tape is used for the base metal, a barrier layer in the form of Pt foil having a thickness of 5 μm is laminated on the base metal, and Ag foil having a thickness of 10 μm and a {110}<110> texture is laminated onto the Pt foil. This oxide superconducting conductor was produced using the same synthesis conditions for the diffusion layer and oxide superconductor layer other than the base material as the conditions of Sample E in the above Embodiment 3. Those conditions are shown in Table 7. Furthermore, although the barrier layer was formed by laminating Pt foil in the present embodiment, a barrier layer may also be used in which the Pt layer is formed by sputtering and so forth. In addition, the texture of the Ag foil may also be formed by performing heat treatment after having laminated the Ag foil.

TABLE 7

| Base material conditions | | |
|---|---|---|
| Base metal | Hastelloy tape (10(W) × 50(L) × 0.09(t) mm | |
| Barrier layer | Pt foil (0.005(t) mm) | |
| Ag foil | {110}<110> texture (0.01(t) mm/0.05(t) mm | |

| Synthesis conditions | Metal intermediate layer (Cu) | Oxide superconductor layer (YBaCuO) |
|---|---|---|
| Base material transport conditions | 6.0 m/h | 1.0 m/h |
| Set synthesis temperature | 700° C. | 780° C. |
| Raw material composite ratio (Y:Ba:Cu) | 0:0:1.0 | 1.0:3.0:2.7 |
| Raw material solution concentration | 7.0 wt % | 7.0 wt % |
| Raw material supply rate | 0.27 ml/min. | 0.27 ml/min. |
| Reaction pressure | 5.0 Torr | 5.0 Torr |
| Set oxygen partial pressure | — | 1.43–1.53 Torr |

[Analysis and Evaluation]

The oxide superconducting conductor produced in the manner described above was designated as Sample G and evaluated for its superconductor characteristics. Those results are shown in Table 8. As shown in Table 8, the Jc value of the oxide superconducting conductor of Sample G, in which a barrier layer was formed between the base metal and Ag foil, was 180,000 A/cm$^2$, and the Jc value was confirmed to have improved considerably in comparison with Sample E of the above Embodiment 3. This is thought to be the result of the diffusion of composite elements of the hastelloy having been effectively suppressed by the barrier layer provided on the base metal, thereby allowing the formation of an oxide superconductor layer having satisfactory crystal orientation on the Ag foil.

TABLE 8

| Sample 10 mm (W) × 50 mm (L) | Barrier layer thickness (μm) | Ag foil thickness (μm) | Oxide superconductor layer thickness (μm) | In-plane orientation* (°) | Ic (A)** | Jc (A/cm$^2$)** |
|---|---|---|---|---|---|---|
| Sample G | 5 | 10 | 0.84 | 17–20 | 15.5 | 1.8 × 10$^5$ |

*The full width at half maximum (FWHM) value of YBaCuO (103) was measured for the in-plane orientation.
**Ic and Jc values were measured under conditions of 1 μV, 77 K and 0 T.

EMBODIMENT 5

Next, the oxide superconducting conductors having the constitution shown in FIG. 4 were produced according to three types of production conditions, and the ratios of each composite element of their oxide superconductor layers were measured. When producing the samples, a CVD production apparatus having three reaction generation chambers as shown in FIG. 10 was used, and the above YBaCuO oxide superconductor layer was formed by supplying the gas of the above YBaCuO oxide superconductor raw material solution having the composite ratios respectively shown in Table 9 to an Ag base material T (the composite ratio of each element is expressed as the molar ratio of the raw material solution). In the case of Experimental Example 1, a gas of a raw material solution of the same composition was supplied so that the composite ratio of each element Y, Ba and Cu in all three reaction generation chambers was 1:1.9:2.5. IN the case of Experimental Example 2, the gas of the raw material solution was supplied in the same manner as the above Experimental Example 1 so that the gas ratio of the raw material solution of each element Y, Ba and Cu in all of the reaction generation chambers was 1:1.9:2.7. In addition, in Experimental Example 3, the gas of the raw material solution was supplied so that elementary Cu was in excess by adjusting the gas ratio of the raw material solution of each element of Y, Ba and Cu was adjusted to be 1:1.9:2.7 in the reaction generation chamber in which the oxide superconductor layer was formed directly above the Ag base material T (composition of first layer), while in the other reaction generation chambers, the gas of the raw material solution was supplied so that the gas of the Cu raw material solution was not in excess by supplying the gas of the raw material solution in a Y:Ba:Cu ratio of 1:1.9:2.5 (composition of second and third layers), thus generating the above YBaCuO oxide superconductor layer. Furthermore, a summary of the experiment conditions are described in Table 9 below.

Moreover, although omitted from the descriptions of Table 9, for Experimental Example 4, an experiment was conducted in which the gas ratio of the raw material solution of each element Y, Ba and Cu was adjusted to 1:1.9:2.9 in the reaction generation chamber in which the oxide superconductor layer is formed directly above the Ag base material T so as to be supplied with the elementary Cu in even greater excess (composition of first layer), while in the other reaction generation chambers, the gas of the raw material solution was supplied so that the gas of the Cu raw material solution was not in excess by supplying the gas of the raw material solution in a Y:Ba:Cu ratio of 1:1.9:2.5 (composition of second and third layers), thus generating the above YBaCuO oxide superconductor layer.

base material, the elementary Cu in the above resulting YBaCuO oxide superconductor was determined to be insufficient. The Jc value (critical current density) of this oxide superconductor was 41,000 A/cm$^2$. In addition, in the case of Experimental Example 2, the composition of each element Y, Ba and Cu of the resulting YBaCuO oxide superconductor was 1:2:3.2, indicating an excess of elementary Cu. This is thought to be the result of the precipitation of CuO on the surface of the above YBaCuO superconductor since there was no diffusion of the excessively supplied elementary Cu into the Ag base material in the third layer (uppermost surface layer). The Jc value of this YBaCuO superconductor also did not reach 100,000 A/cm$^2$, being only 98,000 A/cm$^2$.

In contrast, since the gas of the raw material solution was supplied from reaction generation chamber 9A so that elementary Cu was in excess and the composite ratio of each element Y, Ba and Cu was 1:1.9:2.7 to form the oxide superconductor layer directly above the Ag base material (1$^{st}$ layer) as in Experimental Example 3, since the amount of elementary Cu was able to be adequately replenished even if it diffused into the Ag base material, the composite ratio of Y:Ba:Cu in the resulting oxide superconductor was 1:2:3. In addition, since the composite ratios of the oxide superconductor layers of the second (supplied from reaction generation chamber 9B) and third (supplied from reaction generation chamber 9C) layers was made to be 1:1.9:2.5, which is normally considered to be preferable for forming a YBaCuO oxide superconductor, the composite ratio of each element of the above YBaCuO oxide superconductor was 1:2:3. The Jc value of this oxide superconductor was 110,000 A/cm$^2$, and an oxide superconducting conductor was obtained that had the presumed superconductor characteristics.

In addition, the oxide superconductor obtained in the case of Experimental Example 4 demonstrated a Jc value of 110,000 A/cm2, and an oxide superconductor was obtained that had the presumed superconductor characteristics. As a

TABLE 9

| Superconductor production conditions | Experimental Example 1 | | | Experimental Example 2 | | | Experimental Example 3 | | |
|---|---|---|---|---|---|---|---|---|---|
| Base material | Ag base material in which a rolling texture was formed on the surface (10 mm × 50 mm × 0.3 mm) | | | | | | | | |
| Base material movement speed | 3.0 m/h | | | | | | | | |
| Production temperature | 780° C. | | | | | | | | |
| Raw material composition concentrations in each reaction generation chamber | 1$^{st}$ layer 1:1.9:2.5 | 2$^{nd}$ layer 1:1.9:2.5 | 3$^{rd}$ layer 1:1.9:2.5 | 1$^{st}$ layer 1:1.9:2.7 | 2$^{nd}$ layer 1:1.9:2.7 | 3$^{rd}$ layer 1:1.9:2.7 | 1$^{st}$ layer 1:1.9:2.7 | 2$^{nd}$ layer 1:1.9:2.5 | 3$^{rd}$ layer 1:1.9:2.5 |
| THF raw material solution concentration | 7.0 wt % | | | | | | | | |
| THF raw material supply rate | 0.27 ml/min. | | | | | | | | |
| Reaction pressure | 5.0 Torr | | | | | | | | |
| Set oxygen partial pressure | 1.43–1.53 Torr | | | | | | | | |

As is described in the results of Table 10, in the case of Experimental Example 1, the composition of each element Y, Ba and Cu of the formed YBaCuO oxide superconductor was 1:2:2.8, and since elementary Cu diffused into the Ag result of removing the third and second layers of oxide superconductor of this example by partially grinding to expose the oxide superconductor portion of the first layer followed by measurement of the oxide superconductor composition, the composite ratio of each element was found to be Y:Ba:Cu=1:2:3.1, thus indicating a higher ratio of Cu in the composite ratio of the oxide superconductor of the first layer.

TABLE 10

| Experiment | Thickness (μm) | Composite ratio of YBaCuO superconductor (Y:Ba:Cu) | Ic (A) | Jc (A/cm²) |
|---|---|---|---|---|
| Experimental Example 1 | 0.54 | 1:2:2.8 | 2.2 | 41,000 |
| Experimental Example 2 | 0.56 | 1:2:3.2 | 5.5 | 98,000 |
| Experimental Example 3 | 0.55 | 1:2:3.0 | 6.2 | 110,000 |

EMBODIMENT 6

Oxide superconducting conductors having the constitution shown in FIG. 4 were also produced in this embodiment. The production apparatus having the constitution shown in FIGS. 7 through 10 was used during their production. More specifically, an oxide superconductor tape wire material was produced using hastelloy tape for the base metal, and using a base material having an Ag layer in which an Ag foil, in which was formed a {110}<110> texture, was laminated on this base metal. In addition, in this embodiment, a base material was used in which Ag foil having a thickness of 50 μm was laminated onto a base metal measuring 10(W) mm×50(L) mm×0.09 (t) mm. Furthermore, although Ag foil in which an texture had already been formed was used for the Ag foil, Ag rolled foil may also be laminated onto the base metal followed by heat treatment to form an texture.

To begin with, in order to form a yttrium-based oxide superconductor layer having the composition $Y_1Ba_2Cu_3O_{7-x}$, Ba-bis-2,2,6,6-tetramethyl-3,5-heptanedione-bis-1,10-phenan throline $(Ba(thd)_2 (phen)_2)$, $Y(thd)_2$ and $Cu(thd)_2$ were used for the raw material solution for CVD that is supplied to the reaction generation chamber that forms the oxide superconductor layer directly on the Ag layer (first layer). Each of these was mixed at a molar ratio of Y:Ba:Cu= 1.0:1.9:2.7, and then added to tetrahydrofuran (THF) solvent to a concentration of 7.0 wt % to obtain the liquid raw material (raw material solution) of the oxide superconductor layer. In addition, $Cu(thd)_2$ was added to THF solvent to a concentration of 7.0 wt % to prepare the liquid raw material of the diffusion layer.

Next, raw material solutions having a composite ratio of Y:Ba:Cu=1.0:1.9:2.5 (molar ratio of the raw material solution) for the composition of each material were prepared in the same manner as above for use as the CVD raw material solution for the reaction generation chamber for the second layer and the reaction generation chamber for the third layer.

Next, following completion of the movement of the base material for the required length from the unwinding drum towards the winding drum, the raw material solution of the first layer was continuously supplied to the raw material solution supply section of the liquid raw material supply apparatus at a flow rate of 0.27 ml/min. by a pressurized liquid pump, and simultaneous to this, carrier gas in the form of Ar gas was fed to the carrier gas supply section at a flow rate of about 300 cc/m. As a result of the above operation, a constant volume of liquid raw material mist was continuously supplied into the vaporizer, and the raw material gas resulting from vaporization of the liquid raw material was continuously supplied at a constant volume to the gas diffusion member of the CVD reaction apparatus through a gas feed tube to form the first oxide superconductor layer. The temperature of the vaporizer and feed tube at this time was 230° C.

Next, oxide superconductor layers were formed by laminating the raw material gases of the second and third layers onto the above first superconductor oxide layer. After setting the movement speed of the Ag base material in the reactor to 3.0 m/h, the base material heating temperature to 700° C., the pressure in the reactor to 5.0 Torr (5.0×133 Pa) and the set oxygen partial pressure value to 1.43–1.53 Torr (1.43× 133–1.53×133 Pa), the YBaCuO oxide superconductor layers were continuously formed on the moving base material, and deposition was performed until movement of the base material for the required length was completed.

The resulting YBaCuO oxide superconductor layer having a thickness of 0.5 μm obtained in this manner was then evaluated for its superconductor characteristics. As a result, the Jc value of the YBaCuO superconductor tape wire material was 130,000 A/cm2. In addition, the composite ratio of each element of the YBaCuO superconductor at this time was $Y_1Ba_2Cu_3O_{7-\delta}$, and was able to satisfy the requirement of strength for an oxide superconductor tape wire material.

What is claimed is:

1. An oxide superconducting conductor having an oxide superconductor layer obtained by a method in which a raw material gas of an oxide superconductor is chemically reacted on at least one side of a base material containing Ag and deposited on the above base material; wherein, a diffusion layer in which Cu is diffused in Ag is formed on the surface layer on the oxide superconductor layer side of the above base material, and the above oxide superconductor layer is formed on said diffusion layer.

2. An oxide superconducting provided with an oxide superconducting conductor base material provided with a base metal and an Ag layer having a rolling texture formed on at least one side of said base metal, a diffusion layer formed by diffusing Cu in the surface layer of the Ag layer of the above base material, and an oxide superconductor layer formed on the above diffusion layer.

3. An oxide superconducting conductor comprising the sequential generation of a plurality of layers of an oxide superconductor containing Cu by CVD on a base material for forming an oxide superconductor provided with an Ag layer having a rolling texture formed on at least one side of an Ag base material or other base metal; wherein, among the above plurality of oxide superconductor layers, the Cu content of the oxide superconductor layer immediately above the base material is made to have a higher concentration than the Cu content of the other oxide superconductor layers.

4. The oxide superconducting conductor according to claim 1 or 3 wherein, the base material or Ag base material is composed of pure Ag.

5. The oxide superconducting conductor according to claim 1 or 2 wherein, the Cu content of the diffusion layer is from 50 μg/cm² to 300 μg/cm².

6. The oxide superconducting conductor according to claim 1 or 2 wherein, the layer thickness of the diffusion layer is within the range of 100 nm to 300 nm.

7. The oxide superconducting conductor according to claim 2 or 3 wherein, the film thickness of the Ag layer is within the range of 10 µm to 100 µm.

8. The oxide superconducting conductor according to claim 2 or 3 wherein, a barrier layer is provided between the Ag layer and the base metal.

9. The oxide superconducting conductor according to claim 8 wherein, the film thickness of the Ag layer is within the range of 5 µm to 10 µm.

10. The oxide superconducting conductor according to claim 3 wherein, the Cu content of the oxide superconductor layer directly above the base material preferably has a concentration that is no more than 19% higher than the Cu content of the other oxide superconductor layers.

11. A production method of an oxide superconducting conductor in which an oxide superconductor layer is generated on a base material by a method in which a raw material gas of an oxide superconductor is chemically reacted on at least one side of a base material; wherein, a diffusion layer in which Cu is diffused is deposited on surface layer of the above base material, and the above oxide superconductor layer is deposited on the above diffusion layer.

12. A production method of an oxide superconducting conductor comprising: a step in which a diffusion layer in which Cu is diffused is formed on the surface layer of an Ag layer of an oxide superconducting conductor base material provided with a base metal and an Ag layer having a rolling texture formed on at least one side of said base metal; and, a step in which an oxide superconductor layer is deposited on said diffusion layer by chemically reacting a raw material gas of an oxide superconductor.

13. A production method of an oxide superconducting conductor comprising: the generation of an oxide superconductor containing Cu while supplying a composition of a raw material solution of a reaction generation chamber for generating the above oxide superconductor directly on a base material so that the Cu composition is in greater excess than the above oxide superconductor composition, in the generation of a plurality of layers of oxide superconductor containing Cu by CVD on an oxide superconducting conductor base material provided with an Ag layer having a rolling texture formed on at least one side of an Ag base material or other base metal.

14. The oxide superconducting conductor production method according to claim 11 or 12 wherein, the diffusion layer is deposited to a layer thickness of 100 nm to 300 nm.

15. The oxide superconducting conductor production method according to claim 11 or 13 wherein, an Ag base material having a rolling texture of a (110) orientation is used for the base material.

16. The oxide superconducting conductor production method according to claim 13 wherein, at least two of the above reaction generation chambers are arranged in series, the composition of the above raw material solution of the above reaction generation chamber for generating the above oxide superconductor directly on the above base material is supplied so that the Cu composition is in greater excess than the composite ratio of the above oxide superconductor, and the raw material solution composition in the remaining reaction generation chamber is made to have a Cu composition that allows the obtaining of a prescribed oxide superconductor composition that is not the Cu composition of the reaction generation chambers that generates directly above the base material.

17. The oxide superconducting conductor production method according to claim 13 wherein, the Cu composition in the above reaction generation chamber for generating an oxide superconductor layer directly on the above base material preferably has a concentration that is 1–20% higher than the Cu composition in the other reaction generation chamber.

18. The oxide superconducting conductor production method according to claim 12 of 13 wherein, the thickness of the Ag layer of the above base material for forming the oxide superconductor is from 10 µm to 100 µm.

19. The oxide superconducting conductor production method according to claim 12 or 13 wherein, a barrier layer is formed between the above Ag layer of the above base material for forming the oxide superconductor, and the above base metal.

20. The oxide superconducting conductor production method according to any of claims 11 through 13 wherein, a protective layer composed of a precious metal material can also be formed on the above oxide superconductor layer.

21. The oxide superconducting conductor production method according to any of claims 11 through 13 wherein, the above oxide superconductor layer is composed of a YBaCuO-based oxide superconductor.

22. The oxide superconducting conductor production method according to any of claims 11 through 13 provided with: a reactor that carries out a CVD reaction that forms an oxide superconducting thin film by chemically reacting a raw material gas of an oxide superconductor on at least one side of a moving base material in the form of a tape, an oxide superconductor raw material gas supply means that supplies oxide superconductor raw material gas to the above reactor, and a gas exhaust means that evacuates the gas inside the above reactor;

the above oxide superconductor raw material gas supply means is provided with an oxide superconductor raw material gas supply source, an oxide superconductor raw material gas feed tube, and an oxygen gas supply means that supplies oxygen gas; and, in the above reactor, a base material feed section, reaction generation chambers and base material discharge section are respectively separated by diaphragms, a plurality of the above reaction generation chambers are provided in series in the direction of movement of the above base material tape, base material through holes are formed in each of the above diaphragms, a base material transport region is formed within the above reactor that passes through the base material feed section, the plurality of reaction generation chambers and the base material discharge section, and gas diffusion sections are provided in each of the above plurality of reaction generation chambers; wherein, the above plurality of reaction generation chambers are made to be deposition regions, and deposition is carried out by using a deposition apparatus comprised by the above oxide superconductor raw material gas feed tube being connected to said reaction generation chambers via the above gas diffusion section.

* * * * *